United States Patent
Kim et al.

(10) Patent No.: US 10,068,878 B2
(45) Date of Patent: Sep. 4, 2018

(54) PRINTED CIRCUIT BOARD (PCB), METHOD OF MANUFACTURING THE PCB, AND METHOD OF MANUFACTURING SEMICONDUCTOR PACKAGE USING THE PCB

(71) Applicant: Samsung Electronics Co., Ltd., Suwon-si, Gyeonggi-do (KR)

(72) Inventors: Jin-gyu Kim, Asan-si (KR); Ji-sun Hong, Asan-si (KR); Su-jung Hyung, Cheonan-si (KR); Hyun-ki Kim, Asan-si (KR); Hyun Lee, Busan (KR)

(73) Assignee: SAMSUNG ELECTRONICS CO., LTD. (KR)

( * ) Notice: Subject to any disclaimer, the term of this patent is extended or adjusted under 35 U.S.C. 154(b) by 0 days.

(21) Appl. No.: 15/215,583

(22) Filed: Jul. 20, 2016

(65) Prior Publication Data
US 2017/0040293 A1 Feb. 9, 2017

(30) Foreign Application Priority Data
Aug. 3, 2015 (KR) .......................... 10-2015-0109568

(51) Int. Cl.
*H01L 29/40* (2006.01)
*H01L 25/065* (2006.01)
(Continued)

(52) U.S. Cl.
CPC ........ *H01L 25/0657* (2013.01); *H01L 21/565* (2013.01); *H01L 23/49838* (2013.01);
(Continued)

(58) Field of Classification Search
CPC . H01L 2224/26175; H01L 2224/27013; H01L 2224/83051; H01L 2225/1058;
(Continued)

(56) References Cited

U.S. PATENT DOCUMENTS 6,122,171 A * 9/2000 Akram ................ H01L 23/3121
165/185
6,153,930 A 11/2000 Hori
(Continued)

FOREIGN PATENT DOCUMENTS

JP 05090313 4/1993
JP 05226505 9/1993
(Continued)

*Primary Examiner* — Frederick B Hargrove
(74) *Attorney, Agent, or Firm* — Renaissance IP Law Group LLP

(57) ABSTRACT

Provided are a printed circuit board (PCB) capable of blocking introduction of impurities during a molding process so as to reduce damage on a semiconductor package, a method of manufacturing the PCB, and a method of manufacturing a semiconductor package by using the PCB. An embodiment includes an apparatus comprising: a substrate body comprising an active area and a dummy area on an outer portion of the active area, the substrate body extending lengthwise in a first direction; a plurality of semiconductor units mounted on the active area; and a barrier formed on the dummy area, wherein the barrier extends in the first direction.

19 Claims, 40 Drawing Sheets

(51) Int. Cl.
*H01L 23/00* (2006.01)
*H01L 23/498* (2006.01)
*H01L 25/00* (2006.01)
*H01L 21/56* (2006.01)
*H01L 25/10* (2006.01)
*H01L 23/31* (2006.01)

(52) U.S. Cl.
CPC .............. *H01L 24/11* (2013.01); *H01L 24/14* (2013.01); *H01L 25/105* (2013.01); *H01L 25/50* (2013.01); *H01L 23/3128* (2013.01); H01L 2224/0401 (2013.01); H01L 2224/04042 (2013.01); H01L 2224/06181 (2013.01); H01L 2224/13014 (2013.01); H01L 2224/13016 (2013.01); H01L 2224/13116 (2013.01); H01L 2224/13124 (2013.01); H01L 2224/13139 (2013.01); H01L 2224/13144 (2013.01); H01L 2224/13147 (2013.01); H01L 2224/13155 (2013.01); H01L 2224/13164 (2013.01); H01L 2224/1403 (2013.01); H01L 2224/14131 (2013.01); H01L 2224/16145 (2013.01); H01L 2224/16227 (2013.01); H01L 2224/17181 (2013.01); H01L 2224/32145 (2013.01); H01L 2224/32225 (2013.01); H01L 2224/48091 (2013.01); H01L 2224/48106 (2013.01); H01L 2224/48227 (2013.01); H01L 2224/48228 (2013.01); H01L 2224/73265 (2013.01); H01L 2224/97 (2013.01); H01L 2225/0651 (2013.01); H01L 2225/06513 (2013.01); H01L 2225/06517 (2013.01); H01L 2225/06541 (2013.01); H01L 2225/06562 (2013.01); H01L 2225/06565 (2013.01); H01L 2225/1023 (2013.01); H01L 2225/1058 (2013.01); H01L 2924/15311 (2013.01); H01L 2924/15321 (2013.01); H01L 2924/15747 (2013.01)

(58) Field of Classification Search
CPC . H01L 2924/15331; H01L 2924/15311; H01L 2224/94; H01L 2224/95; H05K 2201/10; H05K 3/368; H05K 3/3436
See application file for complete search history.

(56) References Cited

U.S. PATENT DOCUMENTS

| | | | |
|---|---|---|---|
| 6,287,895 B1* | 9/2001 | Sato | H01L 23/49816 257/E21.508 |
| 6,315,540 B1 | 11/2001 | Tsuruta | |
| 7,482,701 B2 | 1/2009 | Ito et al. | |
| 7,880,276 B2 | 2/2011 | Nishimura et al. | |
| 8,693,211 B2 | 4/2014 | Tamadate | |
| 2003/0145461 A1 | 8/2003 | Kasai et al. | |
| 2007/0141751 A1* | 6/2007 | Mistry | H01L 21/561 438/109 |
| 2007/0231971 A1 | 10/2007 | Peng | |
| 2008/0315410 A1* | 12/2008 | Johnson | H01L 21/563 257/737 |
| 2009/0001606 A1* | 1/2009 | Tamadate | H01L 21/563 257/778 |
| 2016/0005665 A1* | 1/2016 | Suzuki | H01L 21/78 438/15 |

FOREIGN PATENT DOCUMENTS

| | | |
|---|---|---|
| JP | 09064238 | 3/1997 |
| KR | 1998050060 | 9/1998 |
| KR | 100262733 | 8/2000 |
| KR | 100559512 | 3/2006 |
| KR | 100838209 | 6/2008 |
| KR | 20100039691 | 4/2010 |
| KR | 20130107050 A | 10/2013 |

\* cited by examiner

FIG. 6
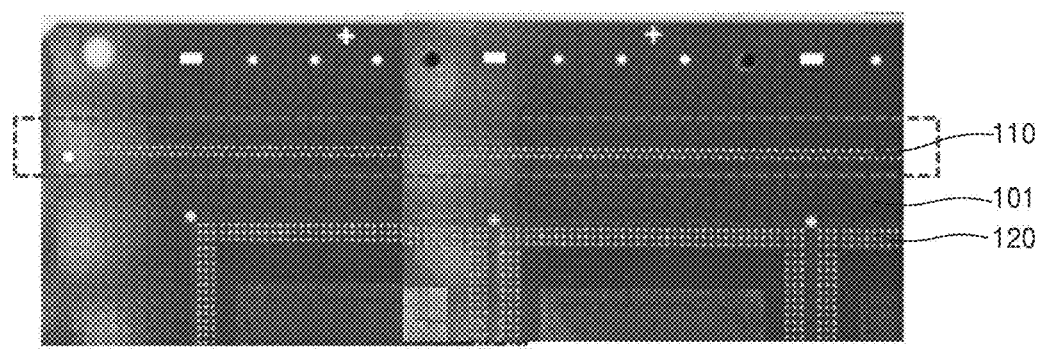

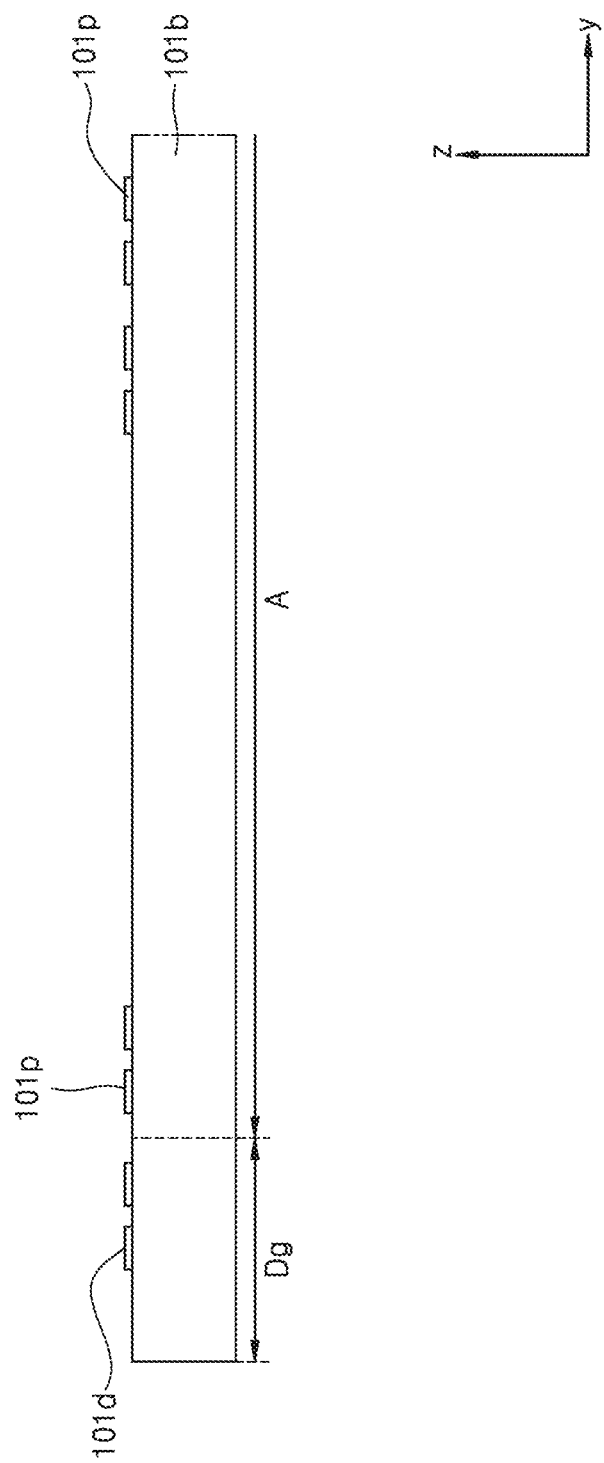

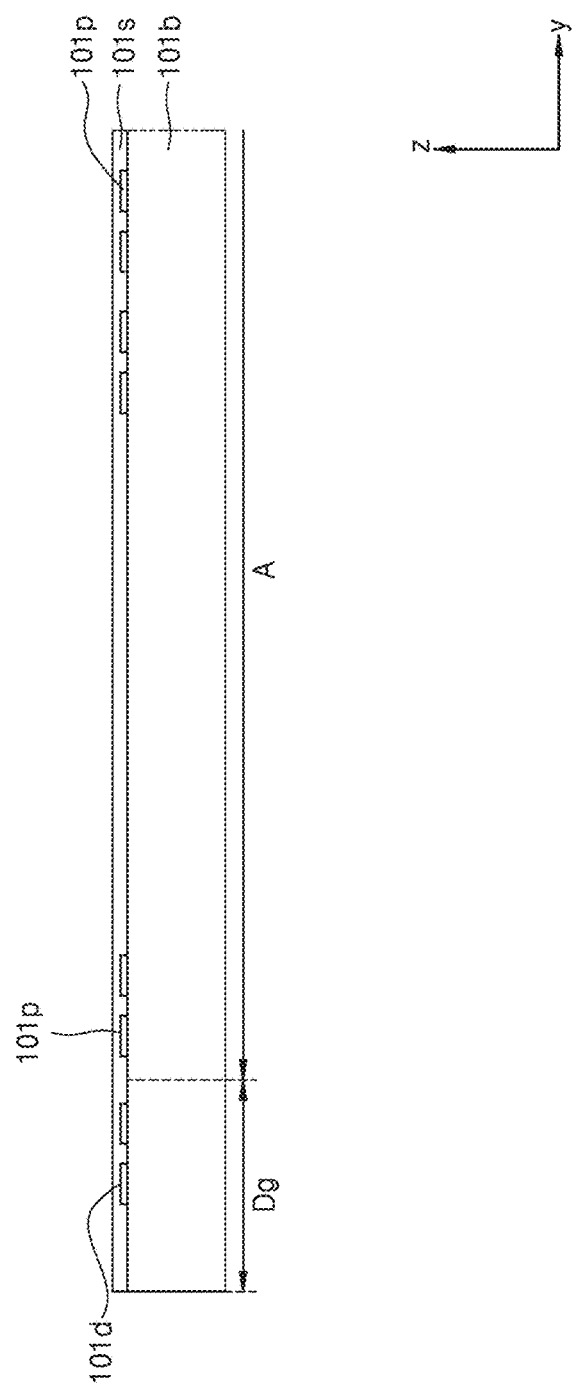

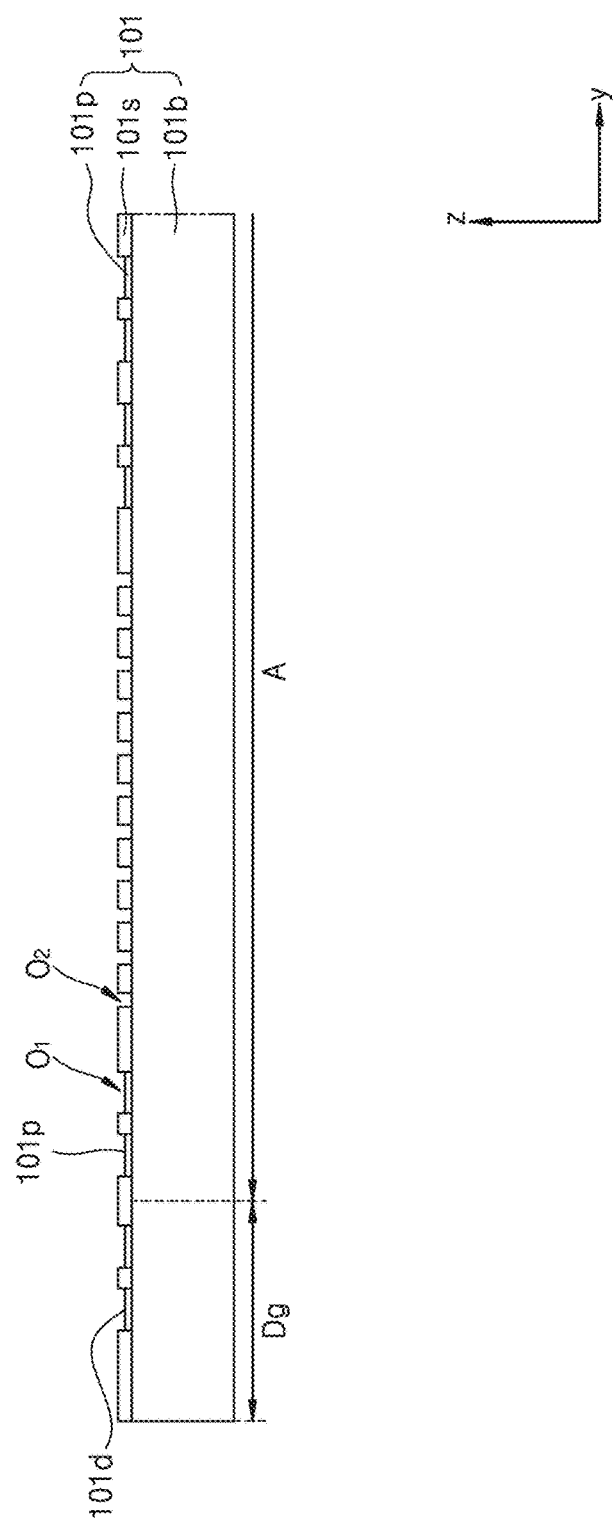

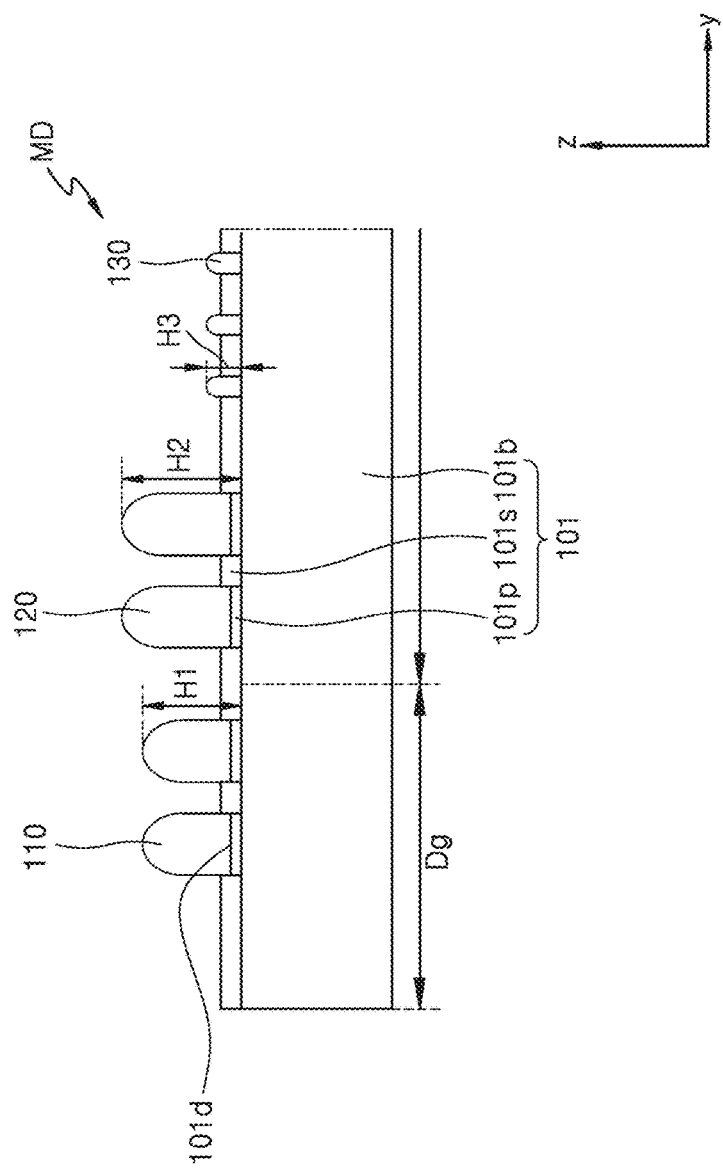

PRINTED CIRCUIT BOARD (PCB), METHOD OF MANUFACTURING THE PCB, AND METHOD OF MANUFACTURING SEMICONDUCTOR PACKAGE USING THE PCB

CROSS-REFERENCE TO RELATED APPLICATION

This application claims the benefit of Korean Patent Application No. 10-2015-0109568, filed on Aug. 3, 2015, in the Korean Intellectual Property Office, the disclosure of which is incorporated herein in its entirety by reference.

BACKGROUND

Embodiments relate to a semiconductor package, and more particularly, to a printed circuit board (PCB) for manufacturing a semiconductor package, and a method of manufacturing a semiconductor package using a PCB.

In general, when a package-on-package (POP) structure is implemented, a semiconductor chip is mounted on a PCB in a flip-chip bonding method, and the semiconductor chip is molded by using a molding resin to fabricate a semiconductor package. In addition, in order to improve processing throughput when the PCB is manufactured and a semiconductor package is manufactured by using the PCB, multiple PCBs are manufactured to be connected to each other. Such a structure in which multiple PCBs are connected is referred to as a PCB strip to be distinguished from an individual PCB. To increase processing yield of the semiconductor package, the semiconductor package is manufactured by mounting multiple chips that are the same as each other on the PCB strip, applying a molded underfill (MUF) technology, in which an epoxy mold compound (EMC) molding and an underfill process are simultaneously performed, and then, cutting and separating the chips.

SUMMARY

An embodiment includes an apparatus, comprising: a substrate body comprising an active area and a dummy area on an outer portion of the active area, the substrate body extending lengthwise in a first direction; a plurality of semiconductor units mounted on the active area; and a barrier formed on the dummy area, wherein the barrier extends in the first direction.

An embodiment includes a printed circuit board (PCB), comprising: a substrate body comprising a gate dummy area and a first row mounting region; and a barrier formed on the gate dummy area; wherein: the first row mounting region comprises a plurality of mounting portions, each including a plurality of pads; and the barrier extends in a line and protrudes from an upper surface of the substrate body.

An embodiment includes a method of manufacturing a semiconductor package, the method comprising: forming a barrier on a substrate; mounting semiconductor units on the substrate; and injecting a molding resin during a molding process through the barrier towards the semiconductor units.

An embodiment includes a method of manufacturing a semiconductor package, the method comprising: preparing a printed circuit board (PCB) that comprises an active area of a substrate and a dummy area on an outer portion of the active area, wherein mounting portions are arranged on the active area, and the preparing comprises forming a barrier extending in a line and protruding from an upper surface of the substrate on a gate dummy area that is adjacent to a gate in the dummy area and forming solder balls around the mounting portions on the active area; mounting semiconductor units on the mounting portions by flip-chip bonding; forming a PCB molding structure by injecting a molding resin through the gate into a mold around the PCB; exposing upper portions of the solder balls by removing a portion of the PCB molding structure; dividing the PCB molding structure into lower semiconductor packages by cutting the PCB molding structure; and stacking an upper semiconductor package on each of the lower semiconductor packages.

An embodiment includes an apparatus, comprising: a substrate; an array of semiconductor units mounted on a surface of the substrate; a plurality of first solder balls electrically connected to the semiconductor units through the substrate; a barrier disposed on the substrate and between the first solder balls and an edge of the substrate, the barrier extending from the surface of the substrate.

BRIEF DESCRIPTION OF THE DRAWINGS

Embodiments will be more clearly understood from the following detailed description taken in conjunction with the accompanying drawings in which:

FIG. 6 is a photograph showing a part of a PCB according to an embodiment;

FIGS. 12A to 12D are cross-sectional views illustrating processes of manufacturing a PCB, according to an embodiment;

FIG. 13 is an expanded view of a rectangular portion denoted by dotted lines in the PCB of FIG. 12D;

DETAILED DESCRIPTION OF THE EMBODIMENTS

Figure 1:
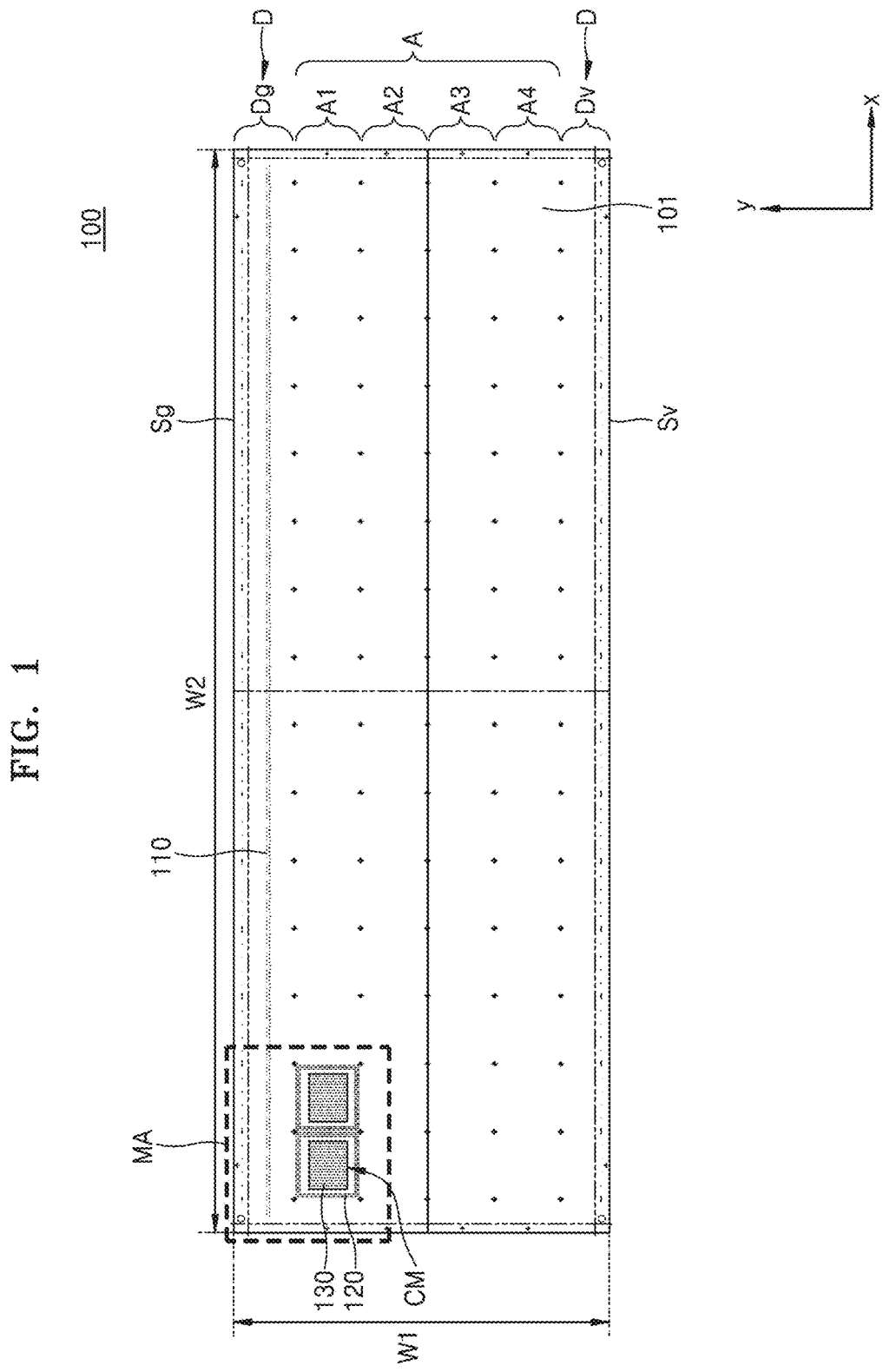
FIG. 1 is a plan view of a printed circuit board (PCB) according to an embodiment.

Embodiments will now be described more fully with reference to the accompanying drawings, in which particular embodiments are shown.

Embodiments may, however, take many different forms and should not be construed as being limited to the particular embodiments set forth herein; rather, these embodiments are provided so that this disclosure will be thorough and complete, and will fully convey the concept to those skilled in the art. The embodiments may be described in the context of particular structures having certain components. One of ordinary skill in the art will readily recognize that embodiments may have other and/or additional components and/or other features not inconsistent with the embodiments described herein. One of ordinary skill in the art will also readily recognize that the methods and structures are described in the context of a structure having a particular relationship to a substrate. However, one of ordinary skill in the art will readily recognize that the method and structure are consistent with other structures. In addition, one of ordinary skill in the art will readily recognize that the layers could have another structure. The methods and structures may also be described in the context of single elements. However, one of ordinary skill in the art will readily recognize that the methods and structures are consistent with the use of multiple elements. In the drawings, the thicknesses of layers and regions are exaggerated for clarity.

It will be understood that when an element, such as a layer, a region, or a substrate, is referred to as being "on" "connected to" or "coupled to" another element, it may be directly on, connected or coupled to the other element or intervening elements may be present. In contrast, when an element is referred to as being "directly on", "directly connected to" or "directly coupled to" another element or layer, there are no intervening elements or layers present. In the drawings, the dimensions of structures are exaggerated for convenience and clarity of the description, and parts having no relation to the description may be omitted. Like reference numerals refer to like elements throughout. The terminology used herein is for the purpose of describing particular embodiments only and is not intended to be limiting of all embodiments. As used herein, the term "and/or" includes any and all combinations of one or more of the associated listed items. Expressions such as at least one of, when preceding a list of elements, modify the entire list of elements and do not modify the individual elements of the list.

FIG. 1 is a plan view of a printed circuit board (PCB) 100 according to an embodiment. Referring to FIG. 1, the PCB 100 according to an embodiment may include a substrate body 101, a barrier 110, a joint solder ball 120, and a bump 130.

The substrate body 101 may include a body layer formed by compressing an epoxy glass (or FR-4) resin, a phenol resin, a BT resin, or the like to a predetermined thickness, and circuit wires formed on the body layer. The circuit wires may be formed by patterning a copper (Cu) foil coated on the body layer; however, in other embodiments, the circuit wires may be formed by forming other conductive structures. In addition, the substrate body 101 may include a protective layer covering the circuit wires, for example, a solder resist (SR) layer. The SR layer may cover the circuit wires while exposing a pad portion on which the barrier 110, the joint solder ball 120, the bump 130, etc. are arranged. The pad may be a part of the circuit wires, or may be separately formed on the circuit wires. Although a lower conductive layer used for fine bumps or wire bonding is referred to as a pad and a lower conductive layer used for solder balls having larger sizes than those of fine bumps is referred to as a land, hereinafter the lower conductive layer will be collectively referred to as a pad.

The substrate body 101 may be classified as the substrate body for a single layer PCB, on which the circuit wires are only formed on a surface, and for a double layer PCB, on which the circuit wires are formed on opposite surfaces. In the substrate body for the double layer PCB, circuit wires on upper and lower portions may be electrically connected to each other via a via contact penetrating through the body layer. In addition, the substrate body 101 may have three or more layers of Cu foil by using an insulator, such as a prepreg, and according to the number of layers of the Cu foil, three or more layers of circuit wires may be formed.

The substrate body 101 may have a rectangular strip structure with a major axis extending in a first direction (x direction). Due to the strip structure of the substrate body 101, the PCB 100 according to this embodiment may be referred to as a PCB strip. The substrate body 101 may have an active area A and a dummy area D. The active area A is located at a center portion on an upper surface of the substrate body 101, and the dummy area D may be located at edges of the upper surface of the substrate body 101, that is, at an outer portion or along portions of the perimeter of the active area A.

The active area A may be an area on which semiconductor units are mounted via fine bumps. When a semiconductor package is manufactured, multiple semiconductor units may be mounted on the active area A in a two-dimensional (2D) array structure. The 2D array structure may be, for example, a 4×15 array structure or a 5×15 array structure, but is not limited thereto. For example, the 2D array structure may be variously defined according to an area of the PCB and sizes of the semiconductor units mounted on the active area A.

An embodiment having particular dimensions will now be described; however, other embodiments may have other dimensions. In particular, the substrate body 101 has a length of about 250 mm in the first direction (x direction), and has a width of about 80 mm in a second direction (y direction). In addition, a mounting area including the semiconductor units or a chip mounting portion (CM) has a length of about 15 mm in the first direction (x direction) and a width of about 15 mm in the second direction (y direction). Here, the mounting area is an area surrounded by four adjacent black dots forming a rectangle, and may include an area, on which the joint solder balls 120 are arranged, surrounding the chip mounting portion CM.

If the semiconductor units are mounted on the substrate body 101 in a 4×15 array structure, there is a margin of about 25 mm in the first direction (x direction) because the length of the semiconductor units becomes 225 mm (15×15), and there is a margin of about 20 mm in the second direction (y direction) because the width of the semiconductor units becomes 60 mm (15×4). Therefore, the semiconductor units may be sufficiently mounted on the active area A in the 4×15 array structure. In addition, the dummy area D on the outer portion of the active area A may have a sufficient area, and thereby ensuring a sufficient space for forming the barrier 110 that will be described later.

If the semiconductor units are mounted on the substrate body 101 in the 5×15 array structure, there is a margin of about 25 mm in the first direction (x direction) because the total length of the semiconductor units is 15×15=225 mm. However, there is a smaller margin of about 5 mm in the second direction (y direction) because the total length of the semiconductor units is 15×5=75 mm Therefore, the semiconductor units may be densely mounted on the active area A in the 5×15 array structure. In addition, the dummy area D on the outer portion of the active area A may have a smaller area, and accordingly, there may be a lack of space for forming the barrier 110 that will be described later. The arrangement of the semiconductor units mounted on the active area A in the 5×15 array structure will be described in more detail later with reference to FIGS. 10 and 11.

On the active area A of the PCB 100 according to this embodiment, the semiconductor units may be mounted in the 4×15 array structure. For example, multiple black dots are shown in the active area A, and as described above, four adjacent dots configuring a rectangle correspond to one mounting region, and the semiconductor unit may be mounted on the chip mounting portion CM in the mounting region. Two mounting regions are shown in a rectangular portion MA on an upper left portion of FIG. 1 denoted by bold dotted lines. Each of the mounting regions may include the chip mounting portion CM, on which the semiconductor unit is mounted, and a region where the joint solder balls 120 surrounding the chip mounting portion CM are arranged. In addition, multiple bumps 130 may be arranged on the chip mounting portion CM.

In addition, the active area A of the PCB 100 according to this embodiment may include first to fourth row mounting regions A1 to A4 from an upper side surface Sg of the substrate body 101. The first row mounting region A1 is immediately adjacent to a gate dummy area Dg, and may include multiple mounting regions arranged along with the first direction (x direction). In each of the mounting regions, the chip mounting portion CM and the region where the joint solder balls 120 are arranged may be included. The fourth row mounting region A4 is an active area immediately adjacent to a vent dummy area Dv, and may include multiple mounting regions arranged along with the first direction (x direction) as well. The second and third row mounting regions A2 and A3 are disposed between the first and fourth row mounting regions A1 and A4, and may each include multiple mounting regions arranged along with the first direction (x direction).

As an example, the semiconductor units mounted on the active area A may be memory chips or logic chips. If the semiconductor unit is a memory chip, the semiconductor unit may include a dynamic random access memory (DRAM), a static RAM (SRAM), a flash memory, an electrically erasable and programmable read only memory (EEPROM), a parameter RAM (PRAM), a magnetic RAM (MRAM), a resistive RAM (RRAM), or the like. If the semiconductor unit is a logic chip, the semiconductor unit may include a micro-processor, a central processing unit (CPU), a controller, an application specific integrated circuit (ASIC), or the like. In other examples, the semiconductor unit may include an application processor (AP) of a system on chip (SoC) type that is used in a mobile system, e.g., a mobile phone, an MP3 player, a navigation system, a portable media player (PMP), or the like.

The dummy area D is disposed on an outer portion of the active area A, and may include the gate dummy area Dg that is adjacent to a gate through which a molding resin is injected when a molding process is performed, and a vent dummy area Dv that is adjacent to a vent, through which air may be inhaled or discharged in the molding process. The gate dummy area Dg may have a predetermined width from the upper side surface Sg of the substrate body 101, which is adjacent to the gate, for example, a width of about 7 to 10 mm. In addition, the vent dummy area Dv may have a predetermined width from a lower side surface Sv of the substrate body 101, which is adjacent to the vent, for example, a width of about 7 to 10 mm Although not shown in detail in the drawings, the dummy area D may further include regions at opposite edges of the active area A in the first direction (x direction). These regions may be vent dummy areas Dv, gate dummy areas Dg, or areas for different and/or multiple purposes.

In FIG. 1, dash-dot-dot lines are denoted on four edges of the substrate body 101, but the dash-dot-dot lines are not marks for distinguishing the active area A from the dummy area D. For example, the dash-dot-dot lines are conceptual lines for distinguishing a map information area on an outer portion from internal area, and may not be actually expressed on the substrate body 101. Here, information about the semiconductor units that are mounted, post-process guide, marks for aligning the PCB 100, and guide holes may be disposed on the map information area.

The active area A and the dummy area D may be actually distinguished from each other by a saw lane defined on an outermost portion of the active area A. The saw lane may correspond to a line on which a cutting process is performed during a saw/sorter process for individualizing each semiconductor package, after performing the molding process for sealing the semiconductor units with the molding resin. That is, the active area A and the dummy area D may be classified as an area that remains as a part of the semiconductor package and a part that is removed, when manufacturing of the individual semiconductor package is finished.

The barrier 110 may be formed on the dummy area D that is adjacent to the gate through which the molding resin is injected in the molding process, that is, the gate dummy area Dg. The barrier 110 is formed as a line along with the first direction (x direction), and may protrude from the upper surface of the substrate body 101 to a predetermined height. The barrier 110 may include, for example, a metal material.

The barrier 110 may include at least one row of multiple solder balls arranged along with the first direction (x direction). Alternatively, the barrier 110 may be formed as a wall or a dam that is continuously connected in at least one row along with the first direction (x direction) or that is discontinuously connected in at least one row. Various structures of the barrier 110 will be described in more detail later with reference to FIGS. 2, 9A to 9E, and 10A to 10C.

The barrier 110 may be configured to block introduction of impurities, besides the molding resin, into the active area A during the molding process. Therefore, the barrier 110 may have a structure that may effectively block the introduction of impurities. Here, the impurities may include epoxy molding compound (EMC) flash remaining after a previous molding process, or filler materials included in the EMC. In addition, the impurities may include particles that are introduced, without regard to the previous molding process. Such impurities may cause a crack or breaking of a sealing material in the post-processing after the molding process, for example, during a saw/sorter process. The crack or breaking of the sealing material may generate shorts between adjacent solder balls, or may generate delamination defects including interlayer delamination or delamination of the sealing material from the PCB 100.

That is, since the barrier 110 is formed on the gate dummy area Dg of the PCB 100 according to this embodiment, the introduction of the impurities into the active area A during the molding process may be prevented, and accordingly, the cracking or breaking of the sealing material may be minimized during the saw/sorter process performed after the molding process. In addition, since the crack or the breaking of the sealing material is minimized due to the impurity blocking function of the barrier 110, semiconductor packages that implemented using the PCB 100 of this embodiment may be more reliable.

Figure 2:
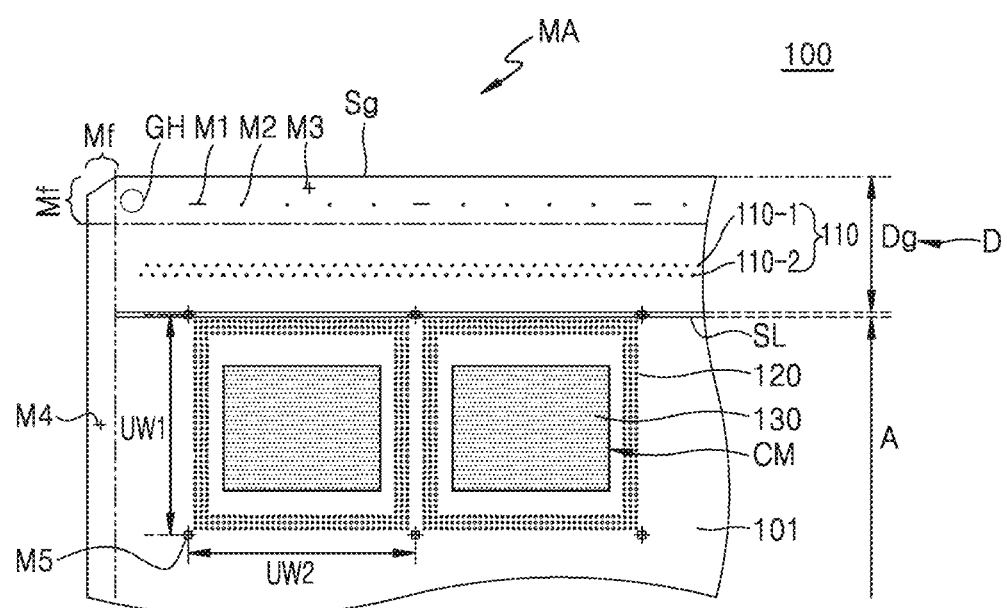
FIG. 2 is an expanded view of a rectangular portion denoted by dotted lines in the PCB of FIG. 1.

The joint solder balls 120 may be arranged to surround the chip mounting portion CM in a rectangular shape. The arrangement of the joint solder balls 120 is not limited to the above rectangular shape, but the joint solder balls 120 may be arranged only on the perimeter of the chip mounting portion CM. As shown in FIG. 2, the joint solder balls 120 may be arranged in three rows, but are not limited thereto. For example, the joint solder balls 120 may be arranged in two or less rows, or four or more rows.

When a semiconductor package, e.g., an upper semiconductor package, is stacked on a lower semiconductor package manufactured from the PCB according to this embodiment, the joint solder balls 120 may mechanically bond and electrically connect the lower semiconductor package and the upper semiconductor package to each other securely. As described above, when the upper semiconductor package is stacked on the lower semiconductor package via the joint solder balls 120, the semiconductor package of the POP type may be manufactured. Sizes of or intervals between the joint solder balls 120 will be described in more detail with reference to FIG. 4, when sizes of or intervals between the solder balls forming the barrier 110 are described.

The bumps 130 may be disposed in the chip mounting portion CM. The bumps 130 may be used when mounting the semiconductor units, e.g., semiconductor chips, on the chip mounting portion CM by a flip chip bonding method. In FIG. 1 or FIG. 2, the bumps 130 are arranged throughout the entire internal area of the chip mounting portion CM, but may be arranged only on a part in the chip mounting portion CM.

The bumps 130 may have small sizes, unlike the joint solder balls 120. For example, each of the bumps 130 may have a size of a few to tens of μm, whereas each of the joint solder balls 120 may have a size of hundreds of μm. Here, the size may denote a height or a horizontal cross-sectional diameter of the bump 130 or the joint solder ball 120.

The semiconductor unit may be mounted on the chip mounting portion CM in a manner that chip bumps are formed on a lower surface of the semiconductor unit and the bumps 130 are coupled respectively to the chip bumps. In some embodiments, the bumps 130 may be omitted, or the chip bumps may be omitted.

Each of the bumps 130 may include a solder or a structure, in which a solder is stacked on a metal pillar. The solder may be formed of, for example, tin (Sn). In some embodiments, the solder may be formed of palladium (Pd), nickel (Ni), silver (Ag), lead (Pb), or an alloy thereof. The metal pillar may be formed of copper (Cu), but is not limited thereto. For example, the metal pillar may be formed of aluminium (Al), Ni, gold (Au), or an alloy thereof. Although solder and a metal pillar have been used as examples, in other embodiments, other conductive materials and structures may be used.

In addition, the PCB 100 according to this embodiment may be a PCB useable with a molded underfill (MUF) process. The MUF process is a processing of sealing an outer portion of a semiconductor chip, and a space between the semiconductor chip and a PCB by using a molding resin through one-shot molding process. In addition, the space between the semiconductor chip and the PCB exists when the semiconductor chip is electrically coupled to the PCB via fine bumps, and is generally filled by an underfill process that is separately performed from the molding process. However, the space may be filled through the molding process without performing an additional underfill process, in the MUF process.

Although not shown in the drawing, one or more holes penetrating through the substrate body 101 may be formed in the mounting portion or in a peripheral portion of the mounting portion, on which the semiconductor units are mounted, in order to perform the MUF process sufficiently. Air may be sucked or discharged via such above holes so that the molding resin may sufficiently flow in between the semiconductor unit and the PCB 100. In addition, a passage connected to the holes may be formed under the PCB 100, and the molding resin may fill in the passage.

The PCB 100 according to this embodiment includes the barrier 110 on the gate dummy area Dg, and accordingly, introduction of impurities into the active area A may be effectively blocked during the molding process. Therefore, according to the PCB 100 of this embodiment, cracking or breaking of the sealing material may be minimized in post-processes of the molding process, e.g., the saw/sorter process. Accordingly, the reduction in the cracking or breaking of the sealing material may result in improving reliability of the semiconductor package, and increasing a manufacturing yield of the semiconductor package.

FIG. 2 is an enlarged view of the rectangular portion MA denoted by dotted lines in the PCB 100 of FIG. 1. Referring to FIG. 2, as shown in the PCB 100 of this embodiment, the dummy area D and the active area A may be divided based on a saw lane SL. In particular, the saw lane SL may be defined between the gate dummy area Dg that is adjacent to the upper side surface Sg of the substrate body 101 and the active area A. The saw lane SL extends in the first direction (x direction), and may have a width of about 200 μm. For example, the saw lane SL may have a width of about 170 μm. Although not shown in FIG. 2, the saw lane SL may extend along with the second direction (y direction) at a left edge of the substrate body 101. In addition, the saw lane SL may be defined between the chip mounting portions CM.

As described above, the saw lane SL may correspond to a line through which cutting is performed by using a blade during the saw/sorter process that is performed after the molding process. A PCB molding structure PM (see FIG. 14C) is separated into semiconductor packages to be individualized by the cutting performed by the blade. Therefore, a region surrounded by the saw lane SL may correspond to one semiconductor package. Although cutting by a blade has been used as an example, in other embodiments, different cutting devices and/or techniques may be used.

In the PCB 100 according to this embodiment, the barrier 110 may include two rows of multiple solder balls. For example, the barrier 110 may include a first row solder balls 110-1 and a second row solder balls 110-2. The barrier 110 is formed on the gate dummy area Dg as described above, and may be disposed on an outer portion of the saw lane SL. Therefore, when the PCB 100 is individualized into separate semiconductor packages through the saw/sorter process, the barrier 110 may not be included in the semiconductor packages.

In addition, the first row solder balls 110-1 and the second row solder balls 110-2 may zigzag with each other. For example, when x-axis coordinate values are assigned to the first row solder balls 110-1 and the second row solder balls 110-2, the first row solder balls 110-1 and the second row solder balls 110-2 may have different x-axis coordinate values from one another. That is, when the first row solder balls 110-1 have x-axis coordinate values such as 1, 3, 5, 7, 9, etc., the second row solder balls 110-2 may have x-axis coordinate values such as 2, 4, 6, 8, etc.

In the PCB 100 of this embodiment, the barrier 110 includes the two rows of solder balls 110-1 and 110-2, and the first and second row solder balls 110-1 and 110-2 are arranged in zigzags along with the first direction (x direction), however, other embodiments are not limited thereto. For example, as shown in FIGS. 8A to 9C, barriers having various structures and arrangements may be adopted in the PCB according to various embodiments. In addition, sizes of or intervals between the first and second row solder balls 110-1 and 110-2 forming the barrier 110 will be described in more detail later with reference to FIG. 4.

On a map information region Mf that is an outer portion of the dash-dot-dot line, a guide ring GH, a column information mark M1, a unit information mark M2, a post-process guide mark M3, and a PCB alignment mark M4 of the chip mounting portion CM may be disposed. The map information region Mf may be included in the dummy area D. In addition, a unit alignment mark M5 may be disposed on an outer portion of the chip mounting portion CM of the active area A. The unit alignment mark M5 may be reference points of the saw lane SL, and accordingly, an internal region surrounded by four unit alignment marks M5 forming a rectangle may correspond to the mounting region or one semiconductor package area.

Figure 3:
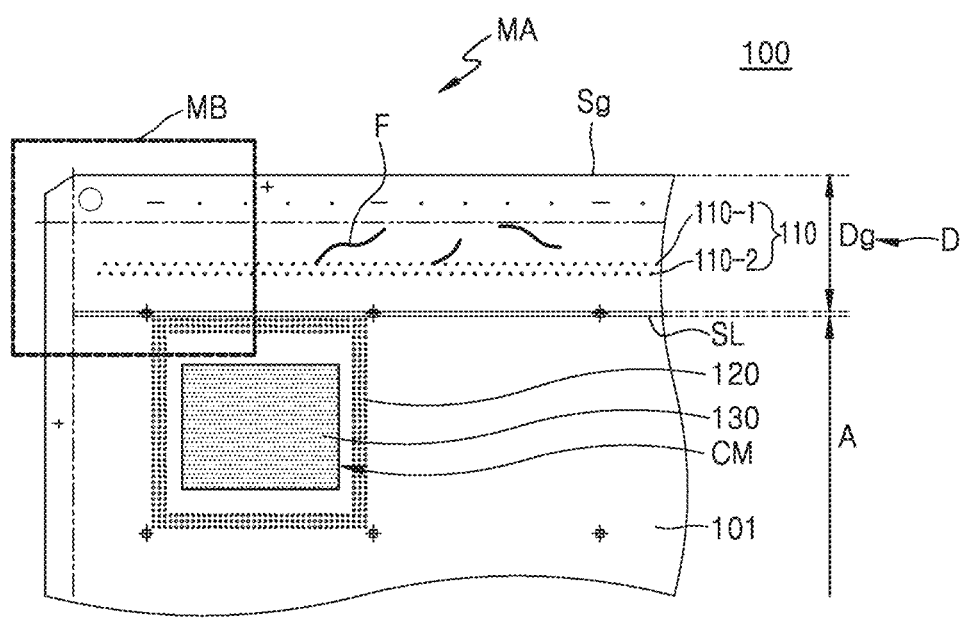
FIG. 3 is a plan view of the rectangular portion of FIG. 2, for describing effects obtained according to the PCB of FIG. 1.

FIG. 3 is a conceptual diagram illustrating effects obtained according to the structure of the PCB of FIG. 1, and may show a plane corresponding to FIG. 2. Referring to FIG. 3, when the barrier 110, e.g., the barrier 110 including the first and second row solder balls 110-1 and 110-2, is formed on the gate dummy area Dg, impurities F injected with the molding resin during the molding process may be blocked by the barrier 110, and accordingly, the introduction of the impurities F into the active area A may be reduced if not prevented. The impurities F may include, for example, EMC flash, filler materials, or external particles. As described above, when the impurities F are introduced into the active area A, the molding resin may be hardened to cause the cracking or breaking of the sealing material during the saw/sorter process.

The impurities F generally have a greater specific gravity than the molding resin. Accordingly, when the molding resin is injected, the impurities F may flow while sinking to a lower portion, and accordingly, may be blocked by the barrier 110 formed on the gate dummy area Dg.

As a reference, if the barrier 110 is not formed on the gate dummy area Dg, the impurities F may be introduced into the active area A, but may be caught by the joint solder balls 120 arranged on the first row mounting region A1 (see FIG. 1) that is adjacent to the gate dummy area Dg. Therefore, most of defects may occur in the semiconductor packages corresponding to the first row mounting region A1 in the post saw/sorter process. Moreover, if the semiconductor unit is not mounted on the chip mounting portion in at least one mounting region in the first row mounting region, the impurities F may be introduced to the second row mounting region.

Figure 4:
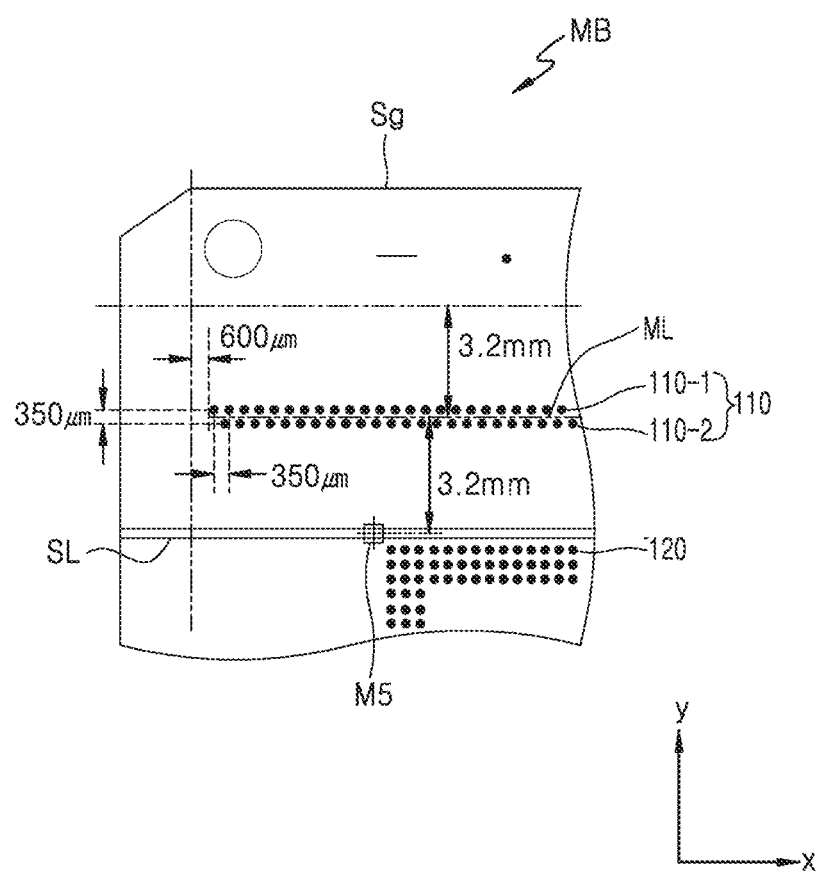
FIG. 4 is an expanded view of a rectangular portion denoted by dotted lines in FIG. 3, in particular, arrangement and sizes of solder balls configuring a barrier.

FIG. 4 is an enlarged view of a rectangular portion MB denoted by dotted lines in FIG. 3, and shows arrangements and sizes of the solder balls forming the barrier 110 in more detail. Although particular dimensions and sizes will be given as an example, in other embodiments, the dimensions may be different. Referring to FIG. 4, the barrier 110 may include the first and second row solder balls 110-1 and 110-2, and the first and second row solder balls 110-1 and 110-2 may be arranged in zigzags along with the first direction (x direction). In addition, the first and second row solder balls 110-1 and 110-2 may have the equal sizes to one another. For example, each of the first and second row solder balls 110-1 and 110-2 may have a ball size of about 190 μm and a height of about 121 μm. Here, the ball size corresponds to a maximum diameter on a horizontal cross-section of the solder ball, and the height may be a height from an upper surface of the substrate body 101 or the pad. In addition, an open diameter of the pad on which the first and second row solder balls 110-1 and 110-2 are arranged, that is, an SR open, may be about 210 μm. However, the sizes of the first and second row solder balls 110-1 and 110-2 and the SR open are not limited to the above numerical values.

In addition, the first and second row solder balls 110-1 and 110-2 may be arranged along with the first direction (x direction) with equal pitches, for example, a pitch of about 350 μm. In addition, a distance between the first row solder balls 110-1 and the second row solder balls 110-2 in the second direction (y direction) may be about 350 μm. Here, when a straight line crossing through centers of the first row solder balls 110-1 is a first straight line and a straight crossing through centers of the second row solder balls 110-2 is a second straight line, the distance in the second direction (y direction) may be defined as a distance between the first and second straight lines.

In addition, as shown in FIG. 4, the first and second row solder balls 110-1 and 110-2 may be arranged at portions 3.2 mm apart respectively from the dash-dot-dot line dividing the map information region Mf adjacent to the upper side surface Sg and the unit alignment mark M5. In more detail, if a straight line located at equal distances from the first and second straight lines is a median line ML, and the first and second row solder balls 110-1 and 110-2 are averagely arranged on the median line ML, the median line ML may be located 3.2 mm apart respectively from the dash-dot-dot line and the unit alignment mark M5. In addition, a distance between a solder ball at a leftmost portion from among the solder balls forming the barrier 110 and the dash-dot-dot line dividing the map information region at a left edge may be about 600 μm.

Pitches between the first and second row solder balls 110-1 and 110-2, distances between the solder balls in the second direction (y direction), and the distance from the dash-dot-dot line are not limited to the above numerical values.

The joint solder balls 120 arranged on the mounting region may include three rows and/or three columns. Locations in the first direction (x direction) of the joint solder balls 120 included in the three rows may be the same as one another, and locations in the second direction (y direction) of the joint solder balls 120 included in the three columns may be the same as one another. For example, three rows of the joint solder balls 120 may be arranged along the first direction (x direction) on the portion adjacent to the barrier 110, and three rows of the joint solder balls 120 may be located at the same points in the first direction (x direction).

In addition, each of the joint solder balls 120 may have a ball size of about 190 μm and a height of about 130 μm. Also, an SR open of the joint solder balls 120 may be about 195 μm. The joint solder balls 120 having the above sizes may be arranged in the first and second directions (x and y directions) with pitches of about 350 μm therebetween.

Arrangement structures, sizes, the SR open, and the pitches of the joint solder balls 120 are not limited to the above numerical values.

Also, as described above, the solder balls 110-1 and 110-2 forming the barrier 110 and the joint solder balls 120 may be similar to each other, in pitches or ball sizes. However, the heights of the solder balls 110-1 and 110-2 forming the barrier 110 may be different from, such as being lower than, those of the joint solder balls 120, and the SR open of the solder balls 110-1 and 110-2 forming the barrier may be different from, such as being greater than that of the joint solder balls 120. The heights of the solder balls 110-1 and 110-2 forming the barrier 110 may be lower than those of the joint solder balls 120, so that the solder balls 110-1 and 110-2 forming the barrier 110 may minimize interference with flow of the molding resin. In other words, in some embodiments, the heights of the solder balls 110-1 and 110-2 forming the barrier 110 do not have to exceed the heights of the joint solder balls 120, and accordingly, may be lower than those of the joint solder balls 120. Consequently, the heights of the solder balls 110-1 and 110-2 forming the barrier 110 may be selected appropriately taking into account the blocking of the impurities and the interference with the flow of the molding resin at the same time. However, in some embodiments, aspects of the solder balls 110-1 and 110-2 forming the barrier 110, such as the height, number, position, or the like may be changed to affect the flow of the molding resin. For example, such aspects may be changed to make the flow of the molding resin exiting the barrier more uniform, different at the sides of the substrate body 101, or the like.

Figure 5A:
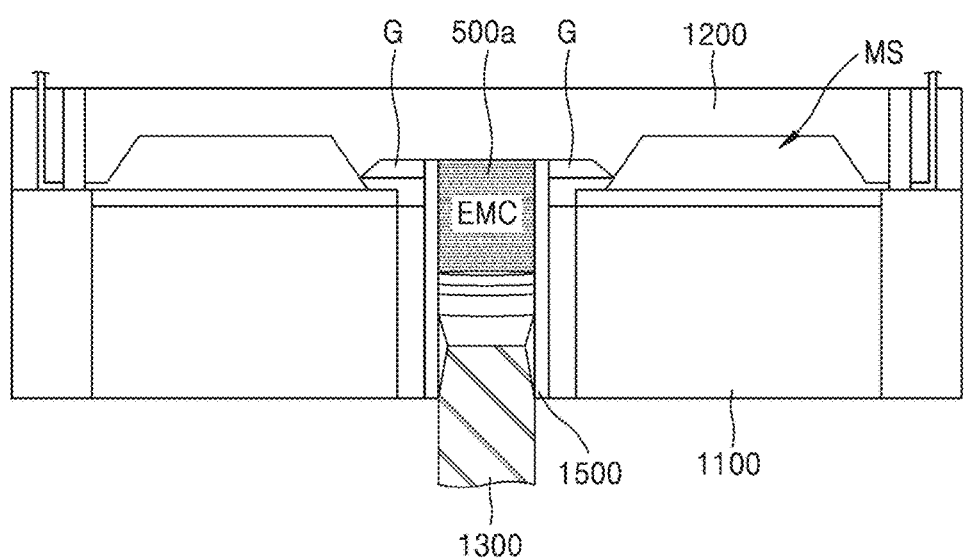
FIGS. 5A to 5E are cross-sectional views illustrating processes of applying a molding process to a PCB according to an embodiment.
Figure 5B:
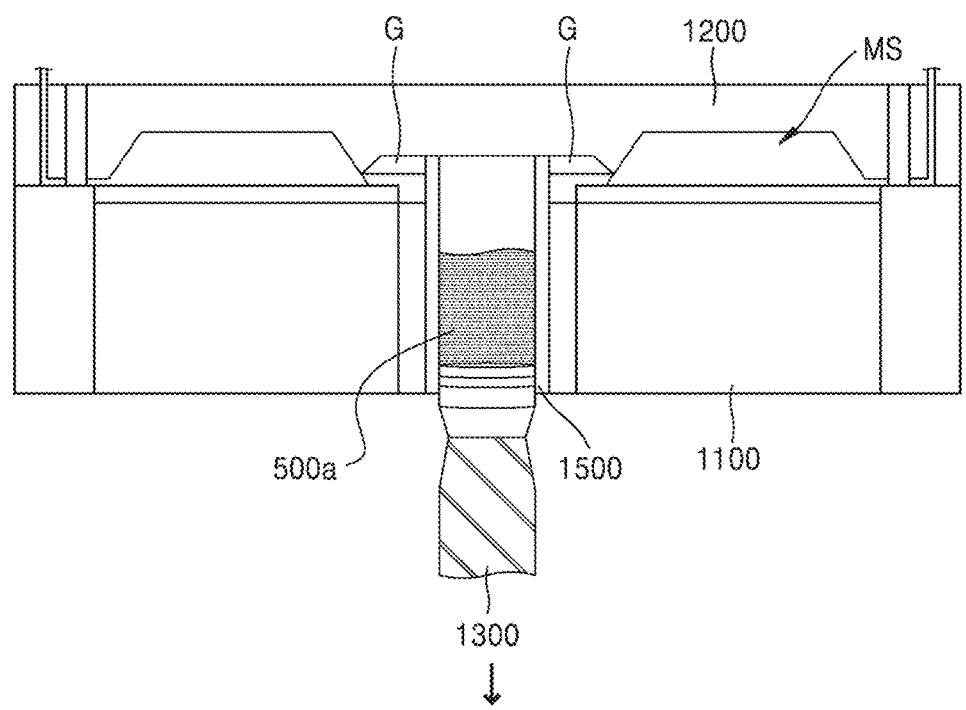

FIGS. 5A to 5E are cross-sectional views illustrating processes of applying a molding process to the PCB 100 to create one or more apparatuses according to an embodiment. Referring to FIGS. 5A and 5B, a mold may include a lower mold 1100 and an upper mold 1200. A molding space MS may be defined between the lower mold 1100 and the upper mold 1200, and the PCB 100 according to this embodiment may be disposed in the molding space MS. Here, the semiconductor units are mounted on the PCB 100 by flip-chip bonding. The molding space MS may be elongated in a direction penetrating into the plane of the drawing. Accordingly, shorter sides of the PCB 100 may be exposed through the molding space MS.

In addition, two molding spaces MS may be defined at opposite sides based on a pot 1500 at a center portion, through which a molding resin 500a is injected, and accordingly, the molding process may be simultaneously performed on two PCBs 100. The molding resin 500a is supplied to the molding spaces MS by vertical reciprocating movements of a ram 1300, and the pot 1500 and the molding spaces MS may be connected to each other via gates G. Then, the ram 1300 rises, and the molding resin 500a may be injected into the molding spaces MS via the pot 1500 and the gates G.

In some embodiments, six pots 1500 may be arranged in parallel with each other in a direction penetrating into the plane of the drawing, and two gates G may be connected to opposite sides of each pot 1500. The number of pots 1500, the arrangement structure of the pots 1500, and the number of gates G and the connecting structure of the gates G are not limited to the above examples.

FIG. 5A shows a state right after the molding process is performed, and FIG. 5B shows a state in which the ram 1300 descends after the molding process is performed. Accompanied with the descending of the ram 1300, the molding resin 500a descends as well, and an inner wall of the pot 1500 may be exposed. In addition, EMC flash, filler materials, and external particles may remain on the inner wall of the pot 1500.

Here, the EMC flash may denote the molding resin remaining after a previous molding process and acting as impurities. The filter materials are particle-phase, fiber-phase, or plate-phase materials that are added and dispersed in a polymer material, in order to increase an amount, improve physical properties, and improve molding process-ability, and may be amorphous or crystalline silica in an EMC molding resin. When a content amount of the filler material is increased, a viscosity of the EMC molding resin increases, and accordingly, flowability of the EMC molding resin may be rapidly lowered. In addition, the filler materials in the EMC molding resin having a large content amount of the filler materials may stick to the inner wall of the pot 1500 and act as impurities during a next molding process.

Figure 5C:
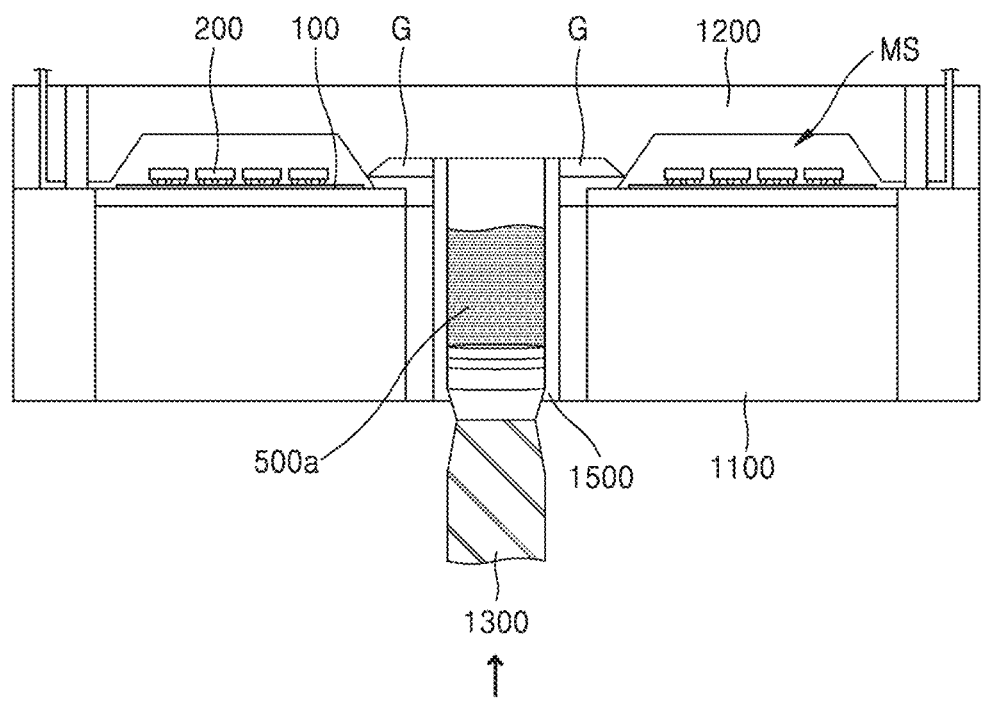
Figure 5D:
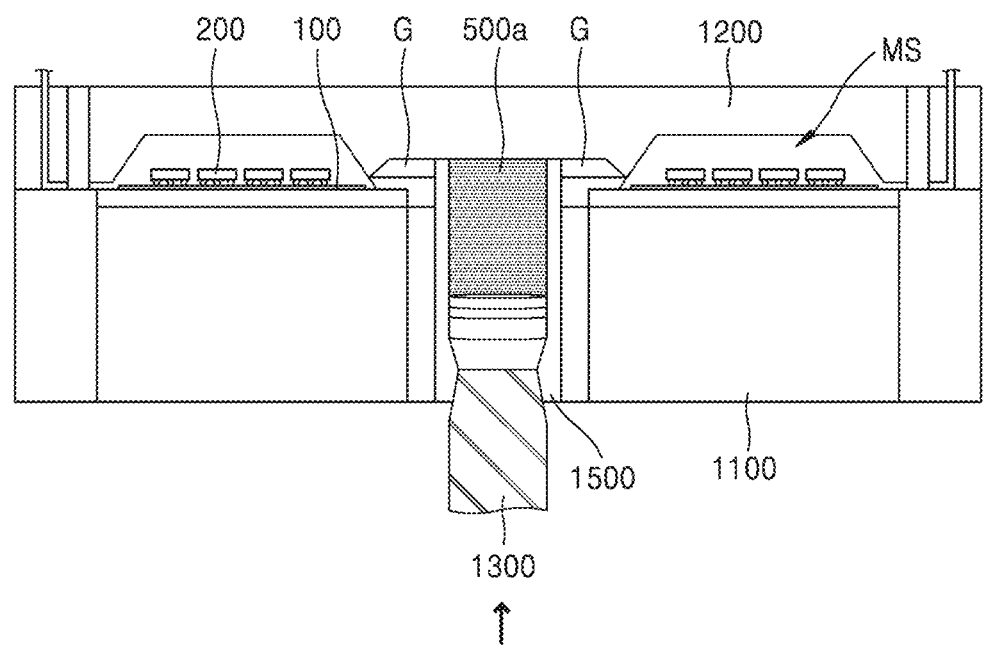

Referring to FIGS. 5C and 5D, when a new molding process is performed, the PCB 100 on which the semiconductor units 200 are mounted is disposed in the molding spaces MS, and the ram 1300 rises as denoted by an arrow so that the molding resin 500a may also rise. When the molding resin 500a rises, the impurities such as the EMC flash, the filler materials, and the external particles that have been stuck to the inner wall of the pot 1500 may be included in the molding resin 500a.

Before performing a new molding process, the upper mold 1200 may rise to be separate from the lower mold 1100, and then, a cleaner may horizontally reciprocate to clean the molding space MS that is exposed due to the separation of the upper and lower molds 1100 and 1200 and a space between the upper and lower molds 1100 and 1200.

Figure 5E:
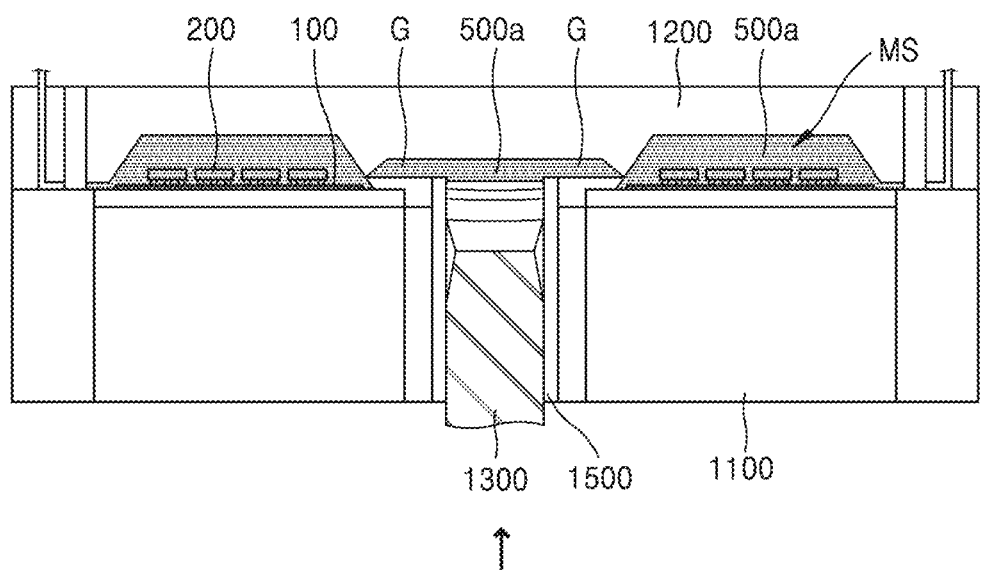

Referring to FIG. 5E, the ram 1300 may further rise so that the molding resin 500a may be injected into the molding spaces MS via the gates G. The molding resin 500a may cover the semiconductor units 200 and fill the spaces between the semiconductor units 200 and the PCB 100 while flowing into the molding spaces MS from the gates G to a vent. Although not shown in the drawings, the barrier 110 is formed on the gate dummy area Dg (see FIG. 1) of the PCB 100 according to the embodiment, and accordingly, the impurities such as the EMC flash, the filler materials, and the external particles are blocked by the barrier 110 so as not to be introduced into the active area A (see FIG. 1) on which the semiconductor units 200 and the joint solder balls 120 (see FIG. 1) are arranged. The impurity blocking effect of the barrier 110 is already described above.

The molding process of this embodiment may be performed as the MUF process for covering all the upper surfaces of the semiconductor units 200, but is not limited to the MUF process. For example, the molding process according to this embodiment may be performed as an exposed-MUF (E-MUF) process that exposes the upper surfaces of the semiconductor units 200. According to the E-MUF process, a ceiling surface of each of the molding spaces MS, that is, a lower surface of the upper mold 1200, may nearly contact the upper surfaces of the semiconductor units 200. In addition, an adhesive tape may be attached to the ceiling surface of the molding spaces MS so that the upper mold 1200 may be easily separate from the sealing material. Accordingly, one or more apparatuses including the PCB 100 on which semiconductor units 200 are mounted may be formed.

Figure 7:
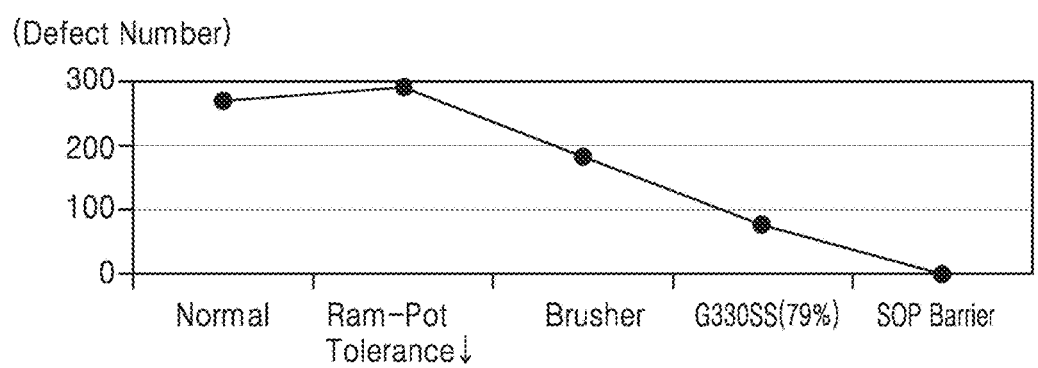
FIG. 7 is a graph illustrating effects in processes of manufacturing a semiconductor package by using the PCB of FIG. 6.

FIG. 6 is a photograph partially showing the PCB 100 according to the embodiment, and FIG. 7 is a graph showing effects in processes of manufacturing the semiconductor package by using the PCB 100 of FIG. 6. Here, 'normal' on an x-axis denotes a case in which a general PCB is used, 'ram-pot tolerance' denotes a case in which a distance between the ram and the pot is reduced, 'brusher' denotes a case in which a cleaning process is sufficiently performed, 'G330SS' denotes a case in which an EMC molding resin having a small content amount of fillers, and 'SOP barrier' denotes a case in which the PCB 100 having the barrier 110 according to this embodiment is used, and y-axis denotes the number of defects expressed in relative values.

Referring to FIGS. 6 and 7, in the PCB 100 of this embodiment, the barrier 110 including two rows of the solder balls between the joint solder balls 120 and the map information region Mf may be formed. The two rows of solder balls are arranged zigzagging along the first direction (x direction), and the sizes of and intervals between the solder balls forming the barrier 110 may be similar to those of the joint solder balls 120.

In addition, as shown in the graph of FIG. 7, the number of defects when the ram-pot tolerance is reduced (ram-pot tolerance ↓), is similar to or greater than that of the 'normal' case, when a general PCB is used. In addition, when the cleaning is enhanced (brusher), the number of defects decreases, but there are still many defects. When the content amount of the filler materials is reduced (G330SS), the number of defects is considerably reduced, but there are still some defects. In addition, if the content amount of the filler materials is reduced, hardness of the sealing material may degrade.

On the other hand, when the PCB 100 according to this embodiment is used, the number of defects nearly close to 0. Therefore, when the semiconductor packages are manufactured by using the PCB 100 according to various embodiments, the defects caused by the impurity introduction may be prevented completely. Also, when the PCB 100 according to an embodiment is used, a reduction in the hardness of the sealing material due to the reduction in the filler content amount may not occur.

Figure 8A:
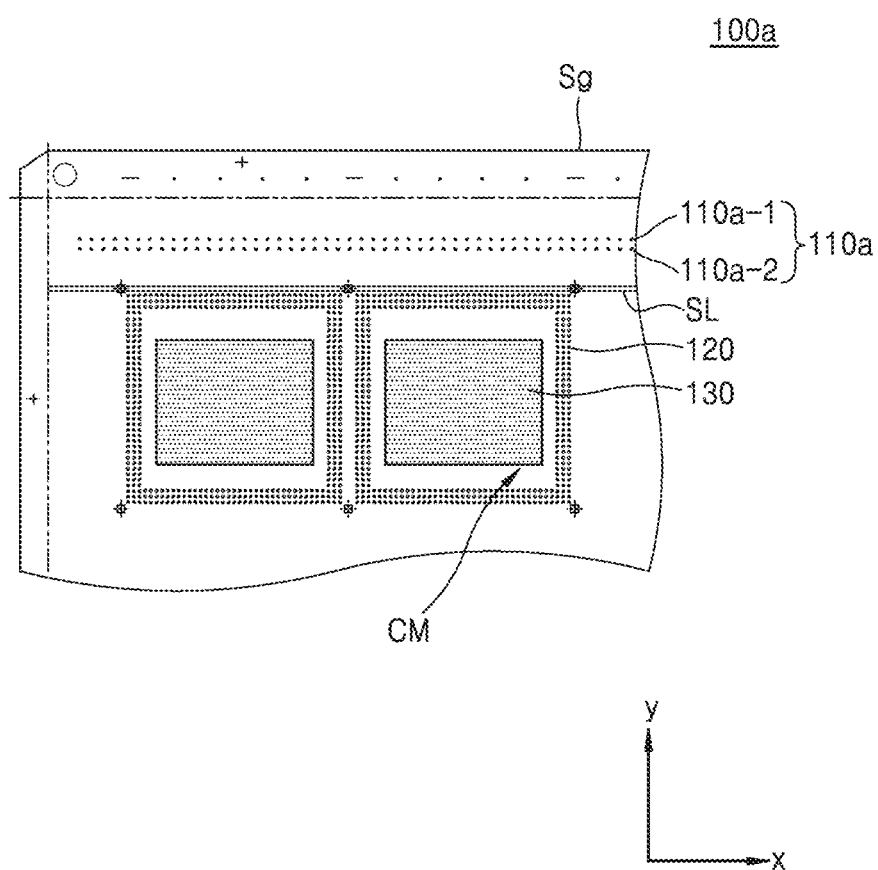
FIGS. 8A to 8F are plan views of PCBs according to one or more embodiments, and correspond to FIG. 2.

FIGS. 8A to 8F are plane views of PCBs according to one or more embodiments, and correspond to the PCB 100 of FIG. 2. For convenience of description, elements that are described above with reference to FIGS. 1 to 4 may not be described. Referring to FIG. 8A, a PCB 100a according to this embodiment may be different from the PCB 100 of FIG. 1, in that two rows of solder balls 110a-1 and 110-2 forming a barrier 110a are located at same locations in the first direction (x direction). For example, in the PCB 100a of this embodiment, the barrier 110a may include the first row solder balls 110a-1 and the second row solder balls 110a-2 that are sequentially arranged from the upper side surface Sg. In addition, locations of the first row solder balls 110a-1 in the first direction (x direction) may be equal to those of the second row solder balls 110a-2 in the first direction (x direction). For example, when x-axis coordinate values 1, 3, 5, 7, etc. are aligned to the first row solder balls 110a-1 in the first direction (x direction), x-axis coordinate values aligned to the second row solder balls 110a-2 may be 1, 3, 5, 7, etc., as well.

Figure 8B:
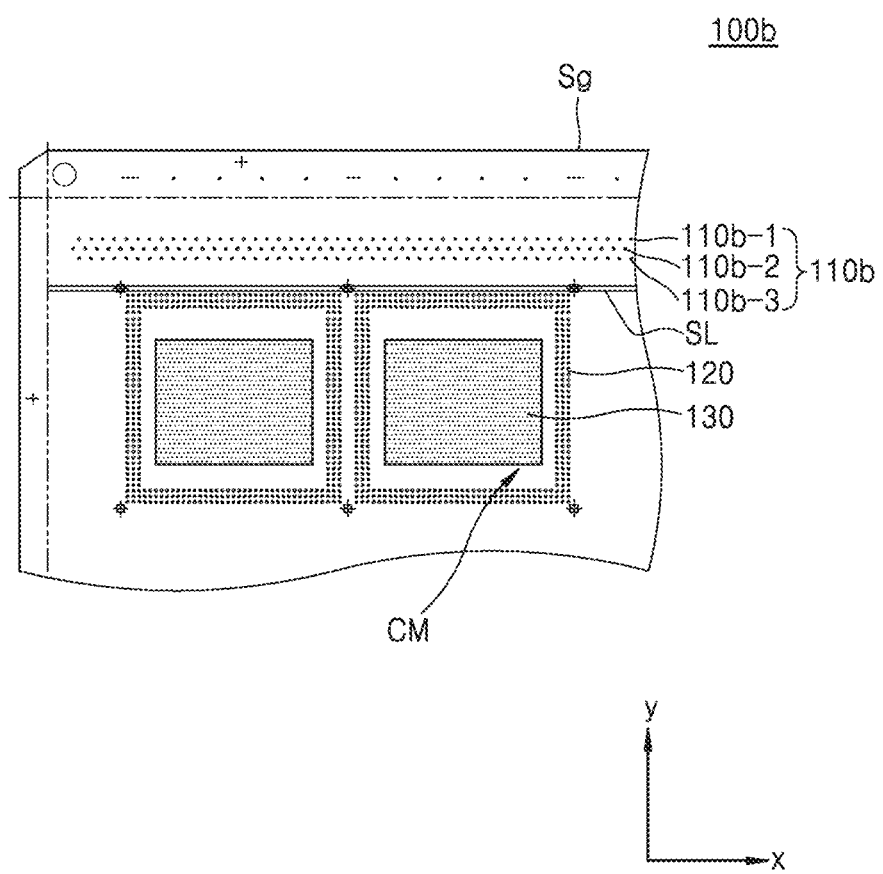

Referring to FIG. 8B, a PCB 100b according to this embodiment may be different from the PCB 100 of FIG. 1 in that a barrier 110b includes first to third row solder balls 110b-1, 110b-2, and 110b-3. For example, in the PCB 100b according to this embodiment, the barrier 110b may include the first row solder balls 110b-1, the second row solder balls 100b-2, and the third row solder balls 110b-3 that are sequentially arranged from the upper side surface Sg. In addition, the second row solder balls 110b-2 may be offset from the first row solder balls 110b-1 or the third row solder balls 110b-3 in the first direction (x direction). In addition, the first row solder balls 110b-1 and the third row solder balls 110b-3 may be located at the same positions in the first direction (x direction).

Figure 8C:
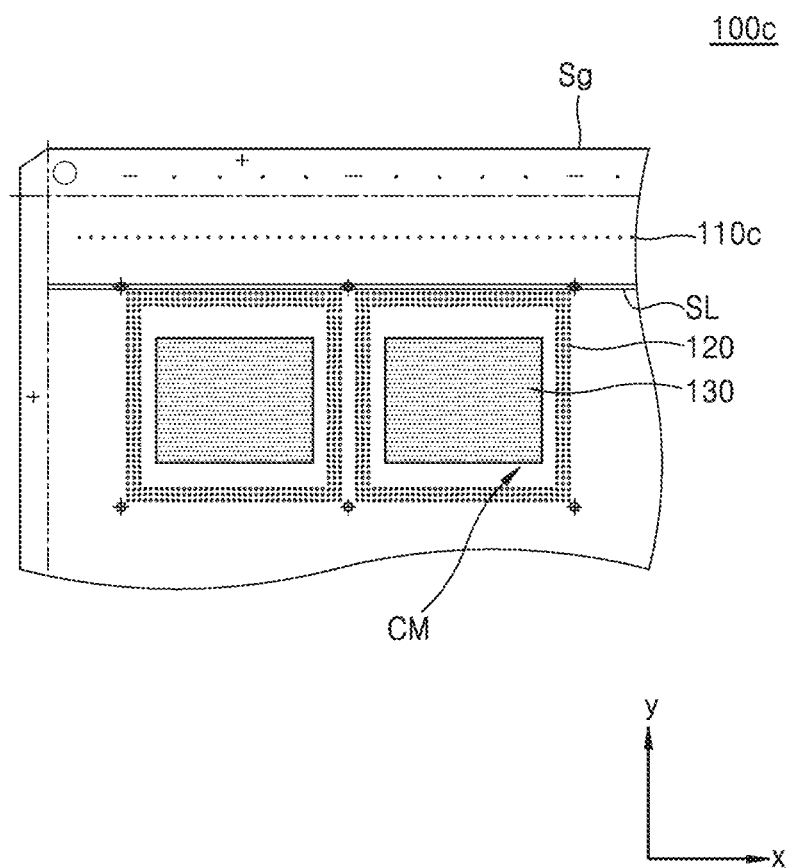

Referring to FIG. 8C, a PCB 100c according to this embodiment may be different from the PCB 100 of FIG. 1, in that a barrier 110c includes a single row of solder balls. For example, in the PCB 100c of this embodiment, the barrier 110c may include a row of solder balls. In addition, in order to block the impurities effectively only by using a row of solder balls, intervals between the solder balls may be less than those of the solder balls forming the barriers 110, 110a, and 110b. For example, if the solder balls forming the barrier 110c and the solder balls forming the barriers 110, 110a, and 110b according to the other embodiments are arranged with the equal pitches in the first direction (x direction), the solder balls forming the barrier 110c according to this embodiment may have greater sizes than those of the solder balls forming the barriers 110, 110a, and 110b according to the other embodiments. On the other hand, if the solder balls forming the barrier 110c according to this embodiment have the same sizes as those of the solder balls forming the barriers 110, 110a, and 110b according to the other embodiment, the pitches between the solder balls according to this embodiment may be smaller than those of the solder balls forming the barriers 110, 110a, and 110b according to the other embodiments.

Figure 8D:
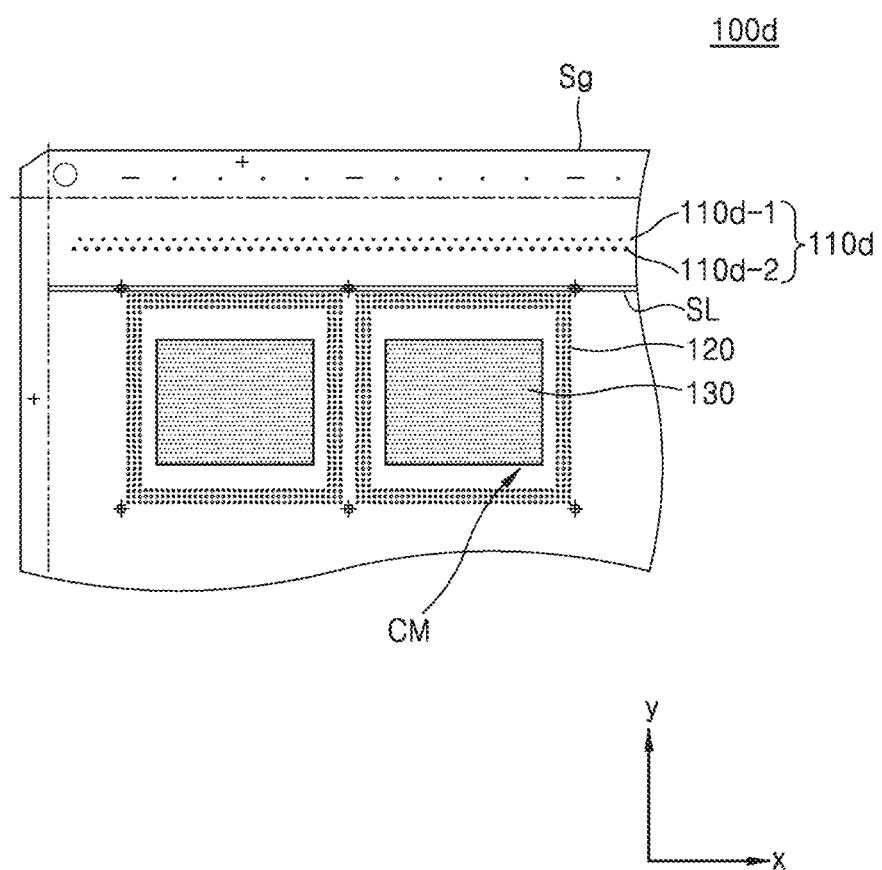

Referring to FIG. 8D, a PCB 100d of this embodiment may be similar to the PCB 100 of FIG. 1, in that a barrier 110d includes first and second row solder balls 110d-1 and 110d-2 and the first and second row solder balls 110d-1 and 110d-2 are misaligned with each other in the first direction (x direction). However, the PCB 100d of this embodiment is different from the PCB 100 of FIG. 1 in that the first row solder balls 110d-1 and the second row solder balls 100d-2 forming the barrier 110d have different sizes from each other. For example, in the PCB 100d of this embodiment, the second row solder balls 110d-2 may have greater sizes than those of the first row solder balls 110d-1. In addition, since the first row solder balls 110d-1 and the second row solder balls 110d-2 are misaligned with each other in the first direction (x direction), pitches between the first row solder balls 110d-1 may be equal to those of the second row solder balls 110d-2.

In addition, in the PCB 100d of this embodiment, the first row solder balls 110d-1 of the barrier 110d may have greater sizes than those of the second row solder balls 110d-2. In addition, similarly to the PCB 100a of FIG. 8A, the first row solder balls 110d-1 and the second row solder balls 110d-2 may be arranged at the same locations in the first direction (x direction). In this case, since the pitches of the first row solder balls 110d-1 and the pitches of the second row solder balls 110d-2 are equal to each other, distances between the second row solder balls 110d-2 may be less than distances between the first row solder balls 110d-1. Here, the distance may not correspond to a distance between centers of the solder balls, but may correspond to a space between the solder balls.

Figure 8E:
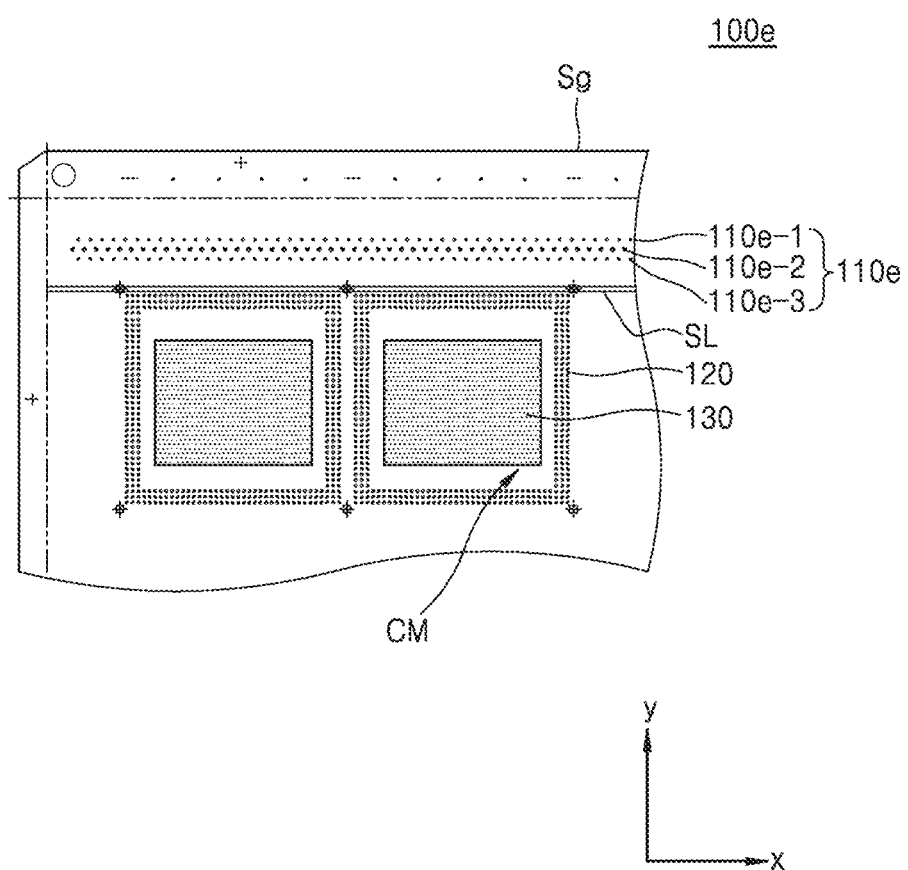

Referring to FIG. 8E, a PCB 100e according to this embodiment is similar to the PCB 100c of FIG. 8C, in that a barrier 110e includes first to third row solder balls 100e-1, 100e-2, and 100e-3, which are misaligned with each other in the first direction (x direction). However, the PCB 100e may be different from the PCB 100c of FIG. 8C in that the first to third row solder balls 100e-1, 100e-2, and 100e-3 forming the barrier 110e have different sizes from each other. For example, in the PCB 100e of this embodiment, the second row solder balls 110*e*-2 may have greater sizes than those of the first row solder balls 110*e*-1 and the third row solder balls 110*e*-3. In addition, the first row solder balls 110*e*-1 and the third row solder balls 110*e*-3 may have the same sizes as those of each other.

In addition, in the PCB 100*e* of this embodiment, the second row solder balls 110*e*-2 of the barrier 110*e* may have smaller sizes than those of the first and third row solder balls 110*e*-1 and 110*e*-3. Otherwise, in the PCB 100*e* of this embodiment, the first row solder balls 110*e*-1, the second row solder balls 110*e*-2, and the third row solder balls 110*e*-3 may have different sizes from each other. Moreover, the first, second, and third row solder balls 110*e*-1, 110*e*-2, and 110*e*-3 may be positioned at the same locations in the first direction (x direction). In addition, the first to third row solder balls 110*e*-1, 110*e*-2, and 110*e*-3 may be arranged with the same pitches as each other, or at least one row solder balls may be arranged with the different pitches from the solder balls in other rows.

Figure 8F:
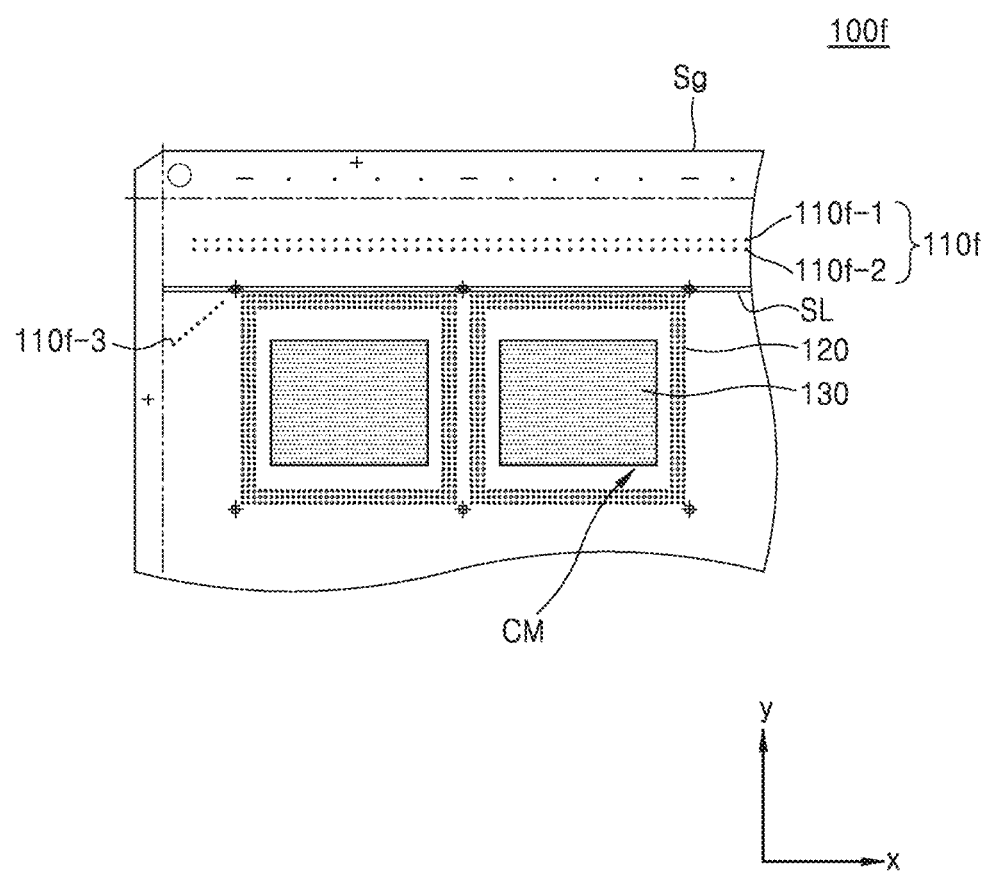

Referring to FIG. 8F, a PCB 100*f* according to this embodiment may be similar to the PCB 100*a* of FIG. 8A; however, in this embodiment, the PCB 100*f* includes solder balls 110*f*-3 disposed on side regions of the PCB 100*f*. That is, the solder balls 110*f*-3 may be disposed in a region between a map information region Mf and saw lane in a second direction (y direction) along unit alignment marks M5. Thus, solder balls 110*f*-1 to 110*f*-3 are formed along multiple sides of a perimeter of the chip mounting portions CM. As a result, impurities in the molding resin that may pass around the outer ends of the solder balls 110*f*-1 and 110*f*-2 may be prevented from entering the sides of the chip mounting portions CM. Although the solder balls 110*f*-2 are illustrated as being disposed in a diagonal orientation, the solder balls 110*f*-2 may have a different orientation in other embodiments.

While barriers having the solder balls of various structures and sizes are described above, structures of the barrier are not limited to the above examples. For example, the barrier may include four or more rows of solder balls. In addition, the rows may have different pitches from each other, or sizes of the solder balls arranged in a row may be different from each other. Furthermore, while straight lines have been used as examples, the rows of solder balls may be disposed in curved lines, segmented lines, or the like. Therefore, in the PCB according to this embodiment, the barrier may be formed as lines having various structures by using the solder balls to block the impurities effectively.

Figure 9A:
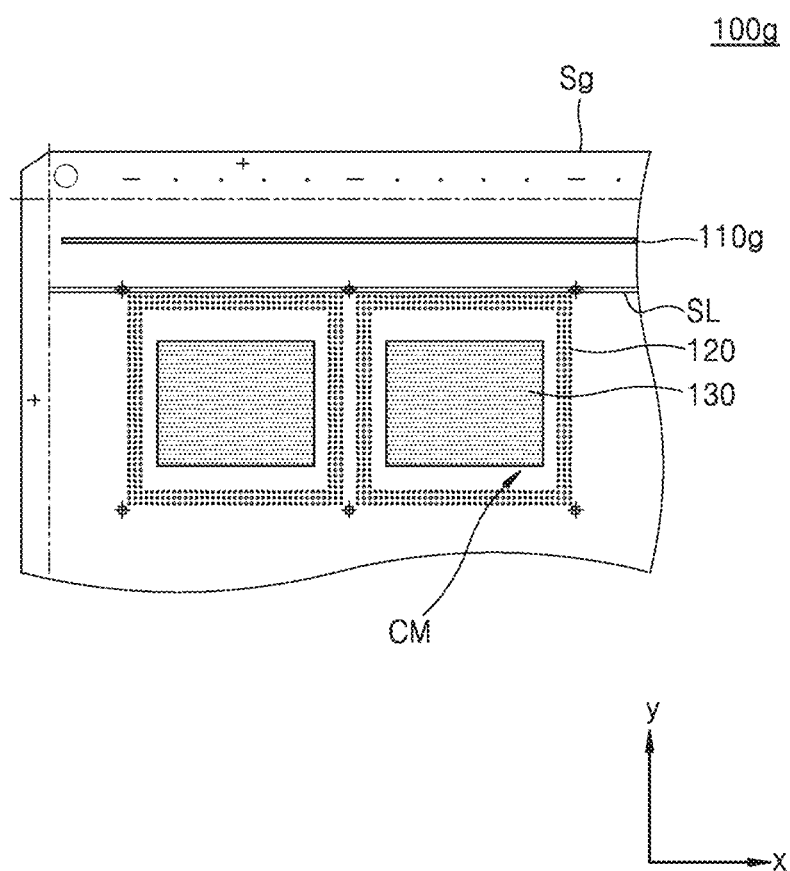
FIGS. 9A to 9D are plan views of PCBs according to one or more embodiments, and correspond to FIG. 2.

FIGS. 9A to 9D are plan views of PCBs according to one or more embodiments, and correspond to the PCB of FIG. 2. For convenience of description, descriptions corresponding to the above descriptions with reference to FIGS. 1 to 4 will be omitted. Referring to FIG. 9A, according to a PCB 100*g* of this embodiment, a barrier 110*g* may extend in the first direction (x direction) like a wall or a dam, unlike the above embodiments. That is, in the PCB 100*g* of this embodiment, the barrier 110*g* may not be formed of the solder balls, but may have a wall structure that continuously extends. The barrier 110*g* in the PCB 100*g* may be formed of a metal material, for example, a solder wire.

In addition, the barrier 110*g* may be formed as a row extending in the first direction (x direction) as shown in FIG. 9A. In other embodiments, the barrier 110*g* may have a structure, in which two or more rows extending in the first direction (x direction). A height of the barrier 110*g* and a width of the barrier 110*g* in the second direction (y direction) may be similar to those of the barriers including the solder balls. For example, the barrier 110*g* in the PCB 100*g* of this embodiment may have a height of about 120 μm. In addition, the width of the barrier 110*g* in the second direction (y direction) may be about 190 μm corresponding to a size of one solder ball. The height of the wall and the width of the wall in the second direction (y direction) in the barrier 110*g* are not limited to the above examples. In some embodiments, where two or more rows extend in the first direction (x direction), the rows may have differing heights and/or widths.

Figure 9B:
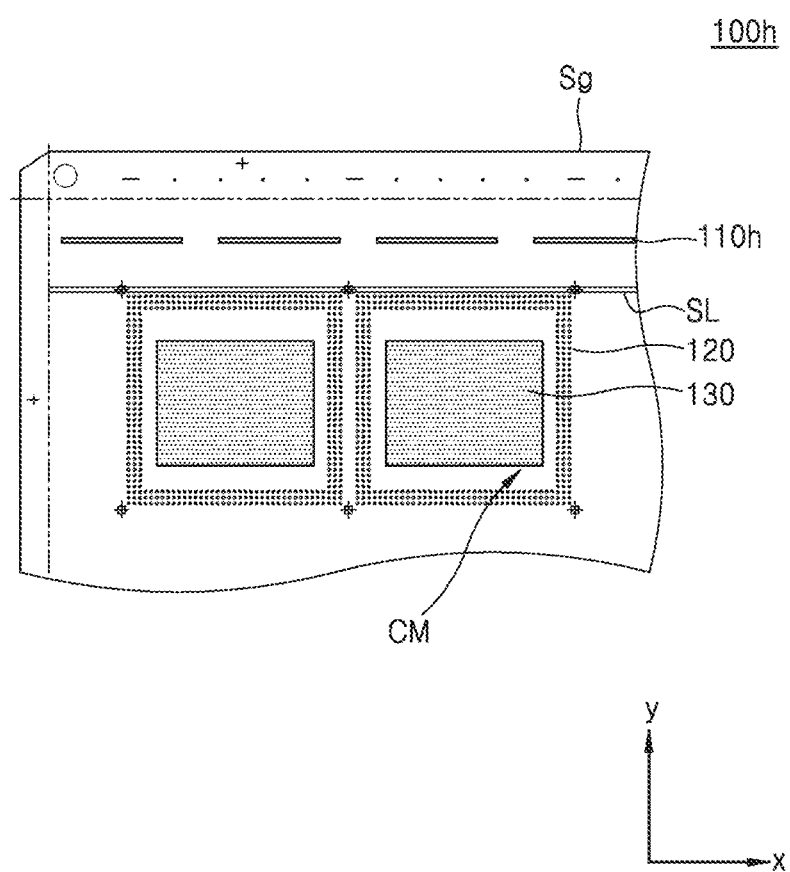

Referring to FIG. 9B, a PCB 100*h* according to this embodiment may be similar to the PCB 100*g* of FIG. 9A, in that the barrier 110*h* has a wall structure. However, the PCB 100*h* is different from the PCB 100*g* of FIG. 9A in that the wall forming the barrier 110*h* is intermittently extended, not continuously. In particular, the barrier 110*h* of the PCB 100*h* according to this embodiment may have a structure, in which multiple walls, each having a predetermined length in the first direction (x direction), are arranged in the first direction (x direction) as spaced apart from each other. In the PCB 100*h* of this embodiment, the walls forming the barrier 110*h* may each have a length of about 1 mm or greater in the first direction (x direction), and a space between the walls may be about 200 μm or less. The lengths of the walls and the intervals between the walls forming the barrier 110*h* are not limited to the above examples. As described above, since the barrier 110*h* has a structure in which the walls are spaced apart from each other, the molding resin may flow sufficiently.

Figure 9C:
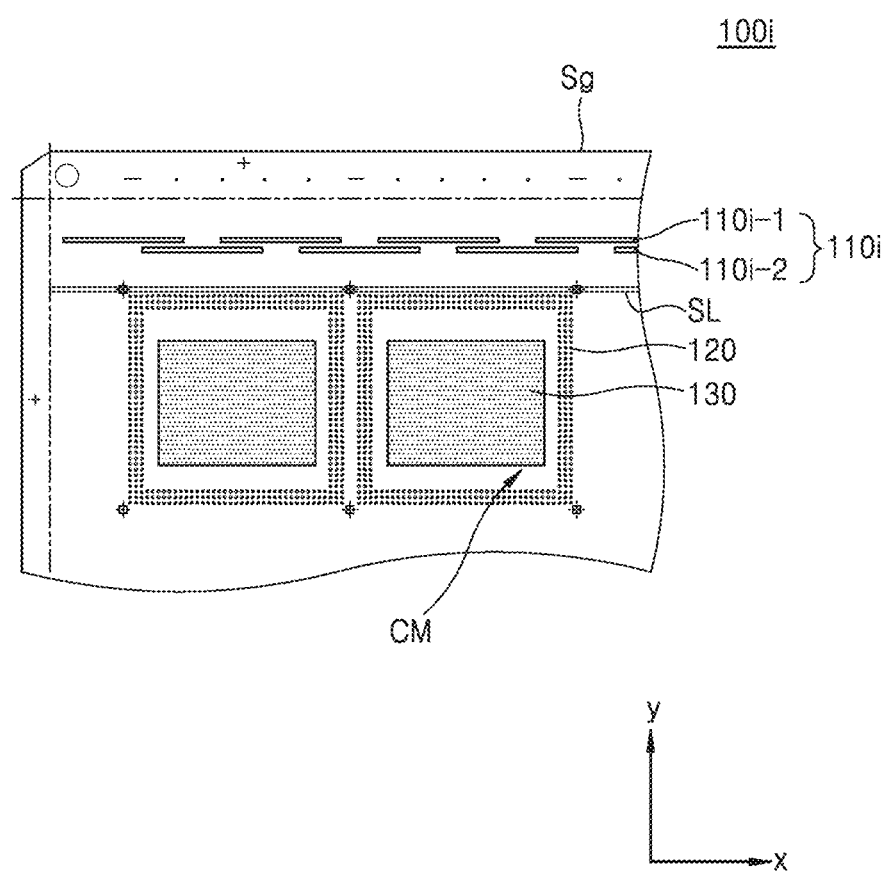

Referring to FIG. 9C, a PCB 100*i* according to this embodiment is similar to the PCB 100*h* of FIG. 9B, in that a barrier 110*i* of this embodiment has multiple walls that are spaced apart from each other. However, unlike the PCB 100*h* of FIG. 9, the barrier 110*i* of the PCB 100*i* according to this embodiment may have two rows of walls 110*i*-1 and 110*i*-2. For example, the barrier 110*i* includes a first row walls 110*i*-2 and a second row walls 110*i*-2. The first row walls 110*i*-1 and the second row walls 110*i*-2 may each have a structure, in which the walls are arranged in the first direction (x direction) while being spaced apart from each other. In addition, the first row walls 110*i*-1 and the second row walls 110*i*-2 may be offset from each other in the first direction (x direction).

That is, when the molding resin flows along the second direction (y direction), spaces between the first row walls 110*i*-1 are blocked by the second row walls 110*i*-2, and spaces between the second row walls 110*i*-2 may be blocked by the first row walls 110*i*-1. In addition, each wall in the first and second row walls 110*i*-1 and 110*i*-2 may have the same length in the first direction (x direction) and the same distances between the walls as those of FIG. 9B.

In the PCB 100*i* of this embodiment, the barrier 110*i* may include two rows of walls 110*i*-1 and 110*i*-2, the number of rows including the walls forming the barrier 110*i* is not limited thereto. For example, the barrier 110*i* may have three or more rows of walls.

Figure 9D:
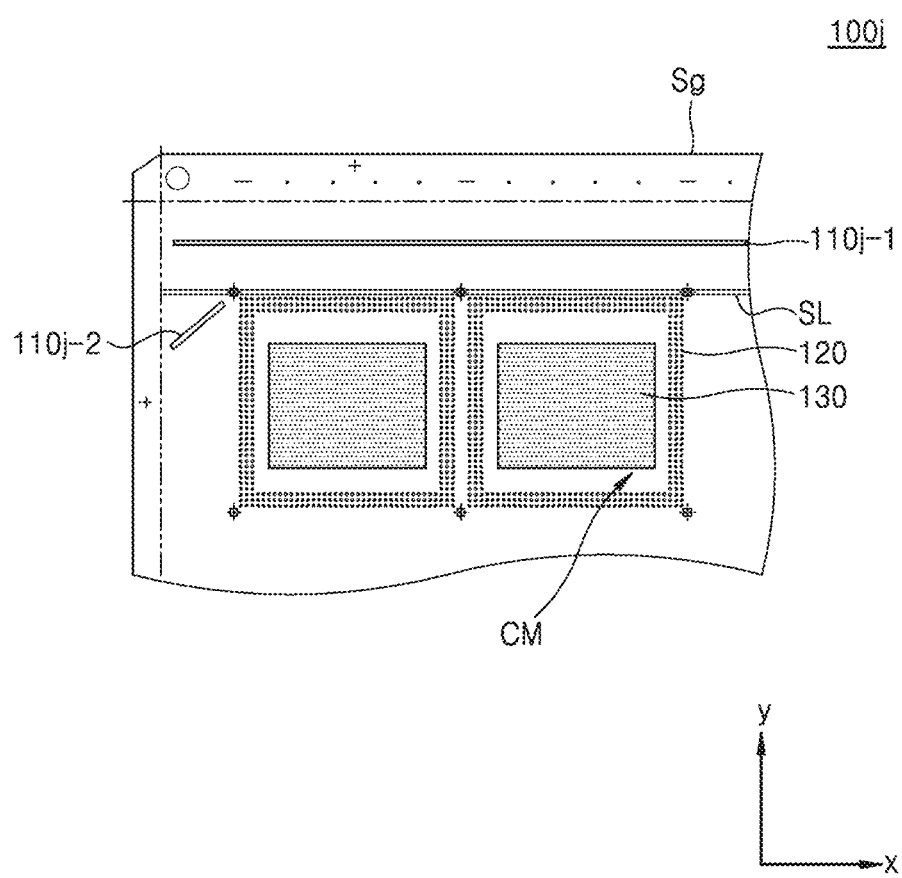

Referring to FIG. 9D, a PCB 100*j* according to this embodiment may be similar to the PCB 100*g* of FIG. 9A, in that the barrier 110*j*-1 has a wall structure. However, in this embodiment, the PCB 100*j* includes a wall or walls 100*j*-2 disposed on side regions of the PCB 100*j*. That is, the wall 100*j*-2 may be disposed in a region between a map information region Mf and saw lane in a second direction (y direction) along unit alignment marks M5. Thus, walls 110*j*-1 to 110*j*-2 are formed along multiple sides of a perimeter of the chip mounting portions CM. Accordingly, impurities in the molding resin that may pass around the outer ends of the wall 100*f*-1 may be prevented from entering the sides of the chip mounting portions CM. Although the wall 100j-2 is illustrated as being disposed in a diagonal orientation, the wall 100j-2 may have a different orientation in other embodiments The PCBs including the barrier structures including the solder balls or the walls, the number, the structures, and the sizes of which may vary, are described as above with reference to FIGS. 8A to 9D. However, other embodiments are not limited to the PCBs including the barrier structures as above. For example, PCBs of all kinds and structures may be included in various embodiments, provided that the barrier in the PCB is formed to intercept impurities in molding material, such as by being disposed as a line on the gate dummy area.

Figure 10:
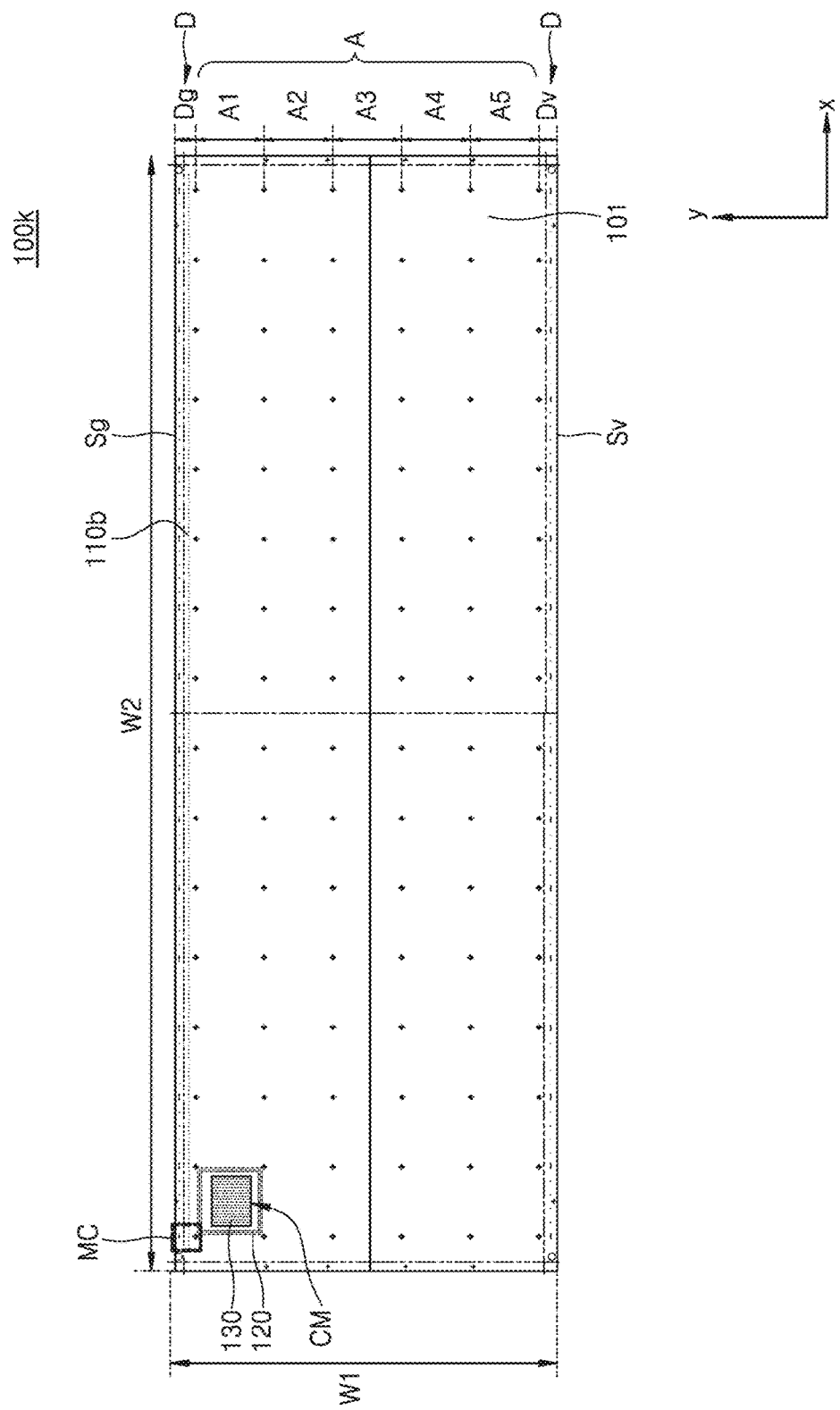
FIG. 10 is a plan view of a PCB according to an embodiment.

FIG. 10 is a plan view of a PCB 100k according to an embodiment. For convenience of description, elements that are described above with reference to FIGS. 1 to 4 will be described briefly or will not be described. Referring to FIG. 10, according to the PCB 100k of this embodiment, semiconductor units may be mounted on the active area A as a 5×15 array, unlike the PCB 100 of FIG. 1. Accordingly, the active area A may include a first row mounting region A1 to a fifth row mounting region A5 from the upper side surface Sg toward the lower side surface Sv of the substrate body 101. Each of the first row mounting region A1 to the fifth row mounting region A5 may include 15 mounting regions arranged in the first direction. In addition, each of mounting regions may have a mounting portion CM and a region on which the joint solder balls 120 are arranged.

In addition, the length of the PCB 100k in the first direction (x direction) and the width of the PCB 100k in the second direction (y direction) may be equal to those of the PCB 100 of FIG. 1. Therefore, as described above with reference to FIG. 1, the active area A may occupy a larger portion of the upper surface of the substrate body 101, and the dummy area D may occupy a smaller area on the upper surface of the substrate body 101. In particular, the gate dummy area Dg adjacent to the gate and the vent dummy area Dv adjacent to the vent may have smaller widths in the second direction (y direction). For example, if the PCB 100k of this embodiment has a width in the second direction (y direction) of about 80 mm, a total width of the gate dummy area Dg and the vent dummy area Dv in the second direction (y direction) may be about 5 mm or less. Also, if the PCB 100k has a width in the second direction (y direction) of about 78 mm, a total width of the gate dummy area Dg and the vent dummy area Dv in the second direction (y direction) may be 3 mm or less.

Since the map information region is disposed on the dummy area D, a space for forming the barrier is small when the semiconductor units are mounted on the active area A in the 5×15 array structure as in the PCB 100k of this embodiment. Therefore, in the PCB 100k of this embodiment, the barrier 110b may have a row of solder balls arranged on the gate dummy area Dg. If there is a spatial margin, the barrier 110b may have two or more rows of solder balls.

Figure 11:
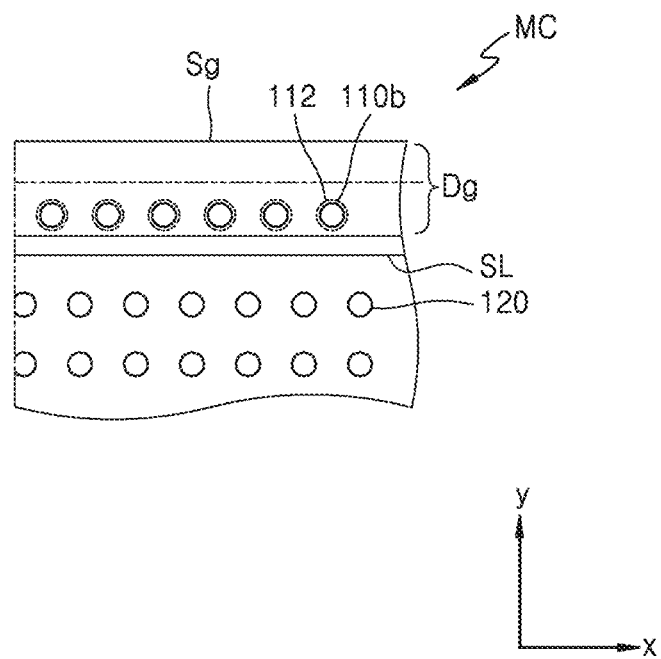
FIG. 11 is an expanded view of a rectangular portion denoted by dotted lines in the PCB of FIG. 10.

FIG. 11 is an enlarged view of a rectangular portion MC denoted by dotted lines in the PCB 100k of FIG. 10. Referring to FIG. 11, the gate dummy area Dg may have a small width in the second direction (y direction), as shown in FIG. 11, for example, about 1.5 mm. If it is assumed that the map information region on an outer portion of the dash-dot-dot line has a width of about 1 mm in the second direction (y direction), a width of the space for forming the barrier 110b is about 0.5 mm in the second direction (y direction). Therefore, the barrier 110b may include a row of the solder balls.

In addition, sizes of the solder balls forming the barrier 110b may be similar to those of the solder balls described above with reference to FIG. 4. For example, the solder balls may each have a height of about 121 μm, the ball size is about 190 μm, the SR open is about 210 μm, and the pitch in the first direction (x direction) is about 350 μm. A circle denoted by the dotted line surrounding each of the solder balls forming the barrier 110b may be a pad or a land, that is, an SR land 112, and may have a diameter of about 270 μm. A portion exposed after covering an outer portion of the SR land 112 by the SR may correspond to an SR open.

Moreover, the joint solder balls 120 on the mounting area may each have a height of about 135 μm, a ball size of about 190 μm, an SR open of about 195 μm, and a pitch in the first direction (x direction) of about 350 μm. Also, although not shown in the drawings, the SR land may have a diameter of about 230 μm.

The sizes and the pitches of the solder balls forming the barrier 110b and the joint solder balls are not limited to the above examples. In addition, a width of the saw lane SL in the second direction (y direction) may be 200 μm or less, but is not limited thereto.

Figure 12D:
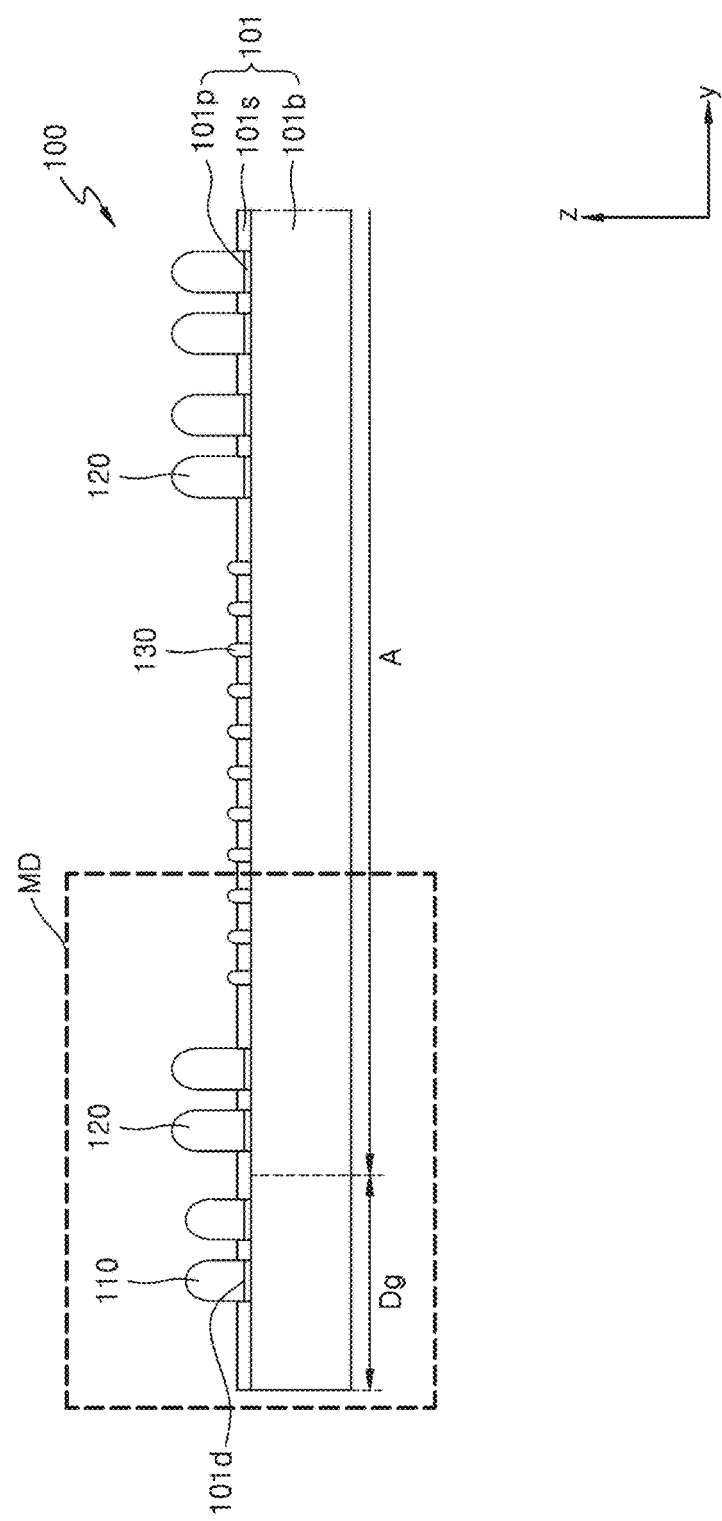

FIGS. 12A to 12D are cross-sectional views illustrating processes of manufacturing a PCB according to an embodiment. For convenience of description, elements that are described above with reference to FIGS. 1 to 4 may be described briefly or may not be described. Referring to FIG. 12A, wires (not shown) and pads 101p and 101d are formed on a body layer 101b. The body layer 101b may be formed by compressing an epoxy glass (or FR-4) resin, a phenol resin, or a BT resin to a predetermined thickness.

The pads 101p and 101d may include the pads 101p for forming the joint solder balls, and dummy pads 101d for forming the solder balls that form the barrier (110 of FIG. 1). The pads 101p are electrically connected to the wires, but the dummy pads 101d may not be electrically connected to the wires. For example, the dummy pads 101d may be conductive layers for improving an adhesive force between the solder balls forming the barrier 110 and the body layer 101b, and may be irrelevant with respect to the electric functions of a packaged device.

The pads 101p are formed on the active area A, and the dummy pads 101d may be formed on the gate dummy area Dg. Here, the pads 101p are arranged by two, taking into account the joint solder balls that may be arranged in two rows or two columns. Therefore, when the joint solder balls are arranged in the three rows or three columns as in the PCB 100 of FIG. 1, the pads 101p may be arranged by three.

Although not shown in the drawings, multiple bump pads for forming fine bumps may be formed on the mounting portion, on which the semiconductor units are mounted by the flip-chip bonding method.

Referring to FIG. 12B, after forming the wires and the pads 101p and 101d, an SR layer 101s may be formed to cover the wires and the pads 101p and 101d. The SR layer 101s prevents the wires from contacting the solder balls and/or the bumps when the solder balls and/or the bumps are formed on the pads, so as to protect the wires.

Referring to FIG. 12C, after forming the SR layer 101s, the SR layer 101s is patterned to expose the pads 101p and 101d. As shown in FIG. 12C, the pads 101p and the dummy pads 101d are exposed via a first opening O1. In addition, the bump pads (not shown) of the chip mounting portion may be exposed via a second opening O2. As shown in FIG. 12C, since the sizes of the bump pads are fine, a width of the second opening O2 may be much less than that of the first opening O1. Through the patterning of the SR layer 101s, the substrate body 101 may be finished. For example, the substrate body 101 may include the body layer 101b, the wires, the pads 101p and 101d, and the SR layer 101s. However, in other embodiments, additional processing may be performed.

Referring to FIG. 12D, after exposing the pads 101p and 101d, the solder balls are formed on the pads 101p and 101d. In more detail, the joint solder balls 120 are formed on the pads 101p, and the solder balls forming the barrier 110 may be formed on the dummy pads 101d. In addition, as shown in FIG. 12D, fine bumps 130 may be formed on the bump pads on the chip mounting portion. Since the solder balls the pads 101p and 101d and the bumps 130 on the bump pads are formed, the PCB 100 according to this embodiment may be completed. However, in other embodiments, additional processing may be performed.

According to the PCB 100 of this embodiment, the barrier 110 including the solder balls is formed on the gate dummy area Dg, and thus the introduction of the impurities into the active area A during the molding process may be reduced or prevented. Accordingly, a chance of cracking or breaking of the sealing material due to the impurities in the saw/sorter process may be reduced or prevented.

FIG. 13 is an enlarged view of a rectangular portion MD denoted by dotted lines in the PCB of FIG. 12D. Referring to FIG. 13, the solder balls forming the barrier 110 may have a first height H1 from an upper surface of the body layer 101b. Also, the joint solder balls 120 may have a second height H2 from the upper surface of the body layer 101b. In addition, the bumps 130 may have a third height H3 from the upper surface of the body layer 101b.

The first height H1 may be equal to or less than the second height H2. For example, the first height H1 may be about 120 μm, and the second height H2 may be about 130 μm. In some embodiments, the solder balls forming the barrier 110 and the joint solder balls 120 have the same sizes as each other, and accordingly, the first height H1 and the second height H2 may be equal to each other. If the solder balls forming the barrier 110 and the joint solder balls 120 are formed to have the same sizes, a speed of forming the solder balls may be improved.

As described above, the height of the solder balls forming the barrier 110 may be determined in view of blocking the impurities and not interfering with the flow of the molding resin. Accordingly, in some embodiments, the first height H1 may not exceed the second height H2.

In addition, the third height H3 may be much less than the first height H1 or the second height H2. For example, the third height H3 may be a few to tens of μm.

Figure 14A:
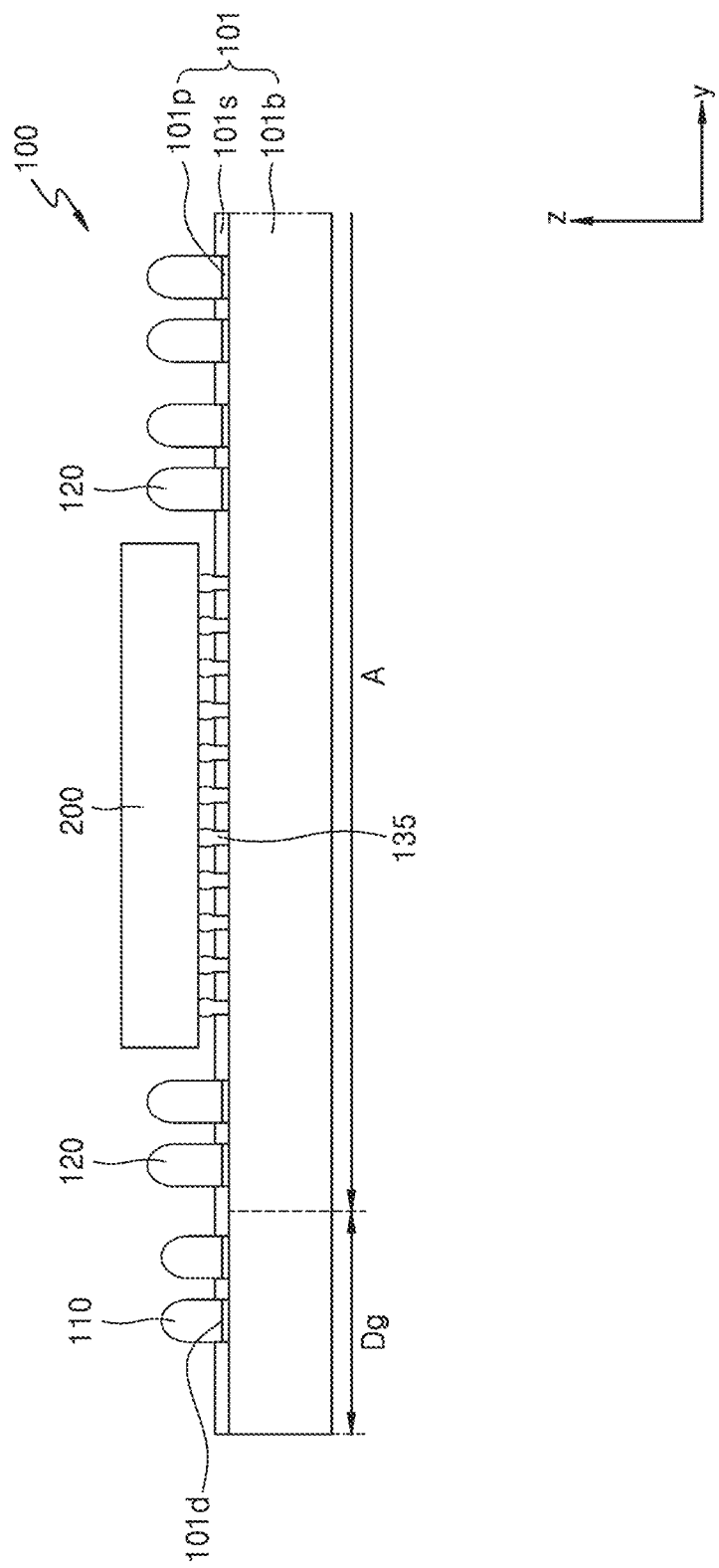
FIGS. 14A to 14F are cross-sectional views illustrating processes of manufacturing a semiconductor package of a package-on-package (POP) type, according to an embodiment.

FIGS. 14A to 14F are cross-sectional views illustrating processes of manufacturing a semiconductor package of a POP type, according to an embodiment. For convenience of description, elements that are described above with reference to FIGS. 1 to 4 may be described briefly or may not be described. Referring to FIG. 14A, a semiconductor unit 200, e.g., a logic chip, is mounted on the chip mounting portion of the active area A in the PCB 100, by the flip-chip bonding method. Chip bumps may be formed on a lower surface of the semiconductor unit 200. Accordingly, the semiconductor unit 200 may be mounted on the chip mounting portion of the PCB 100 in a manner that the chip bumps of the semiconductor unit 200 and the corresponding bumps 130 are fused and bonded to each other. Due to the fusion bonding, the chip bumps and the bumps 130 may be transformed to one integral bump 135.

Figure 14B:
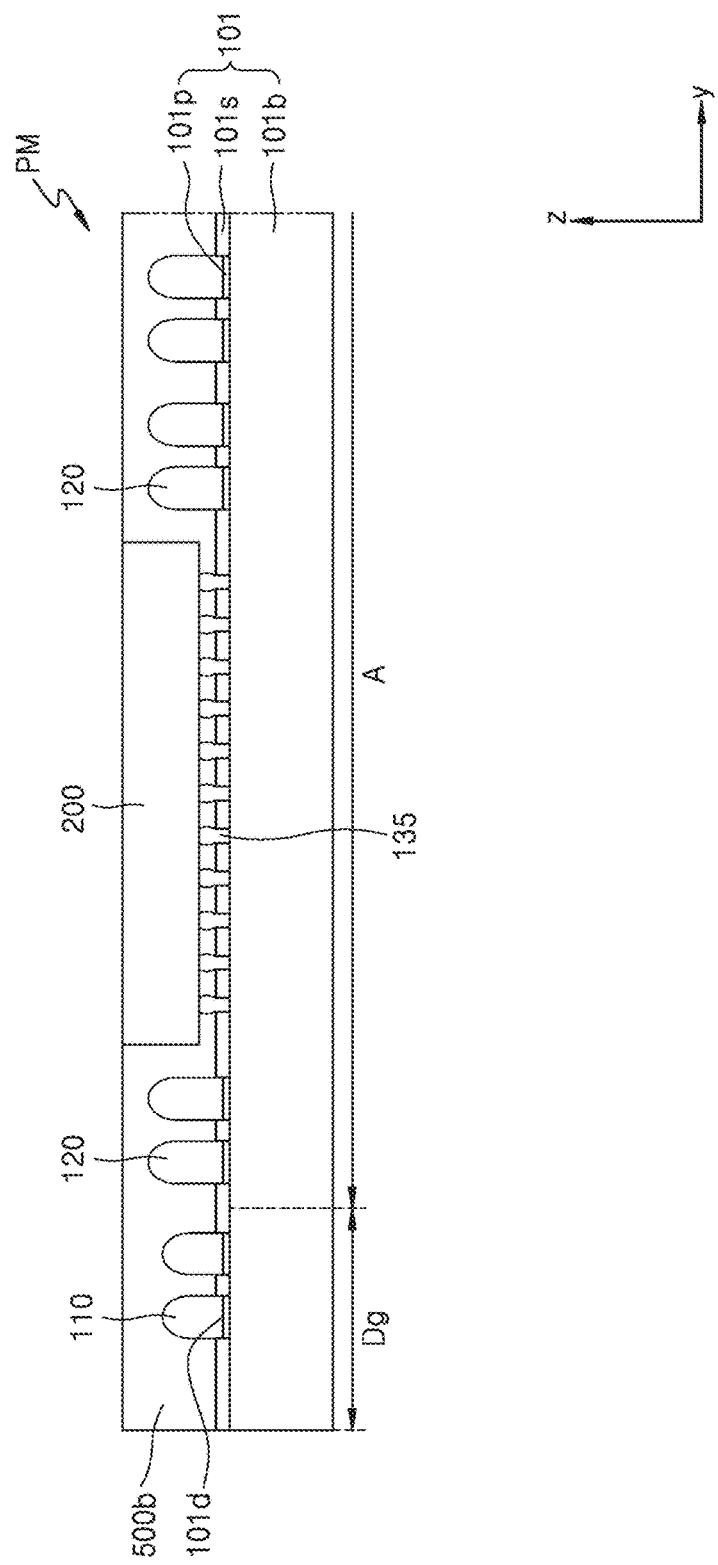

In addition, as shown in FIG. 14A, after mounting the semiconductor unit 200 by the flip-chip bonding method, a space may remain between the semiconductor unit 200 and the PCB 100. Such a space between the semiconductor unit 200 and the PCB 100 may be filled with an insulating material in order to improve bonding reliability and to protect the semiconductor unit 200. Accordingly, according to the processes of manufacturing the semiconductor package of this embodiment, the space between the semiconductor unit 200 and the PCB 100 may be filled with the molding resin during the MUF process, as shown in FIG. 14B. In other embodiments, the space between the semiconductor unit 200 and the PCB 100 may be separately filled through an underfill process, without performing the MUF process.

Referring to FIG. 14B, when the molding process is performed by the MUF process as described above, the semiconductor unit 200 may be sealed by the molding resin and the space between the semiconductor unit 200 and the PCB 100 may be filled with the molding resin. After the molding process, the molding resin is hardened to a sealing material 500b having a predetermined hardness. As described above, when the sealing material 500b is formed on the PCB 100, a PCB molding structure PM may be formed.

In addition, as shown in FIG. 14B, an upper surface of the semiconductor unit 200 may be exposed by the sealing material 500b. The process of exposing the upper surface of the semiconductor unit 200 from the sealing material 500b is referred to as an E-MUF process, as described above. When the molding process is performed as the E-MUF process, a thickness of the sealing material 500b is reduced to be similar to that of the semiconductor unit 200, and accordingly, a height of the entire semiconductor package may be reduced.

Figure 14C:
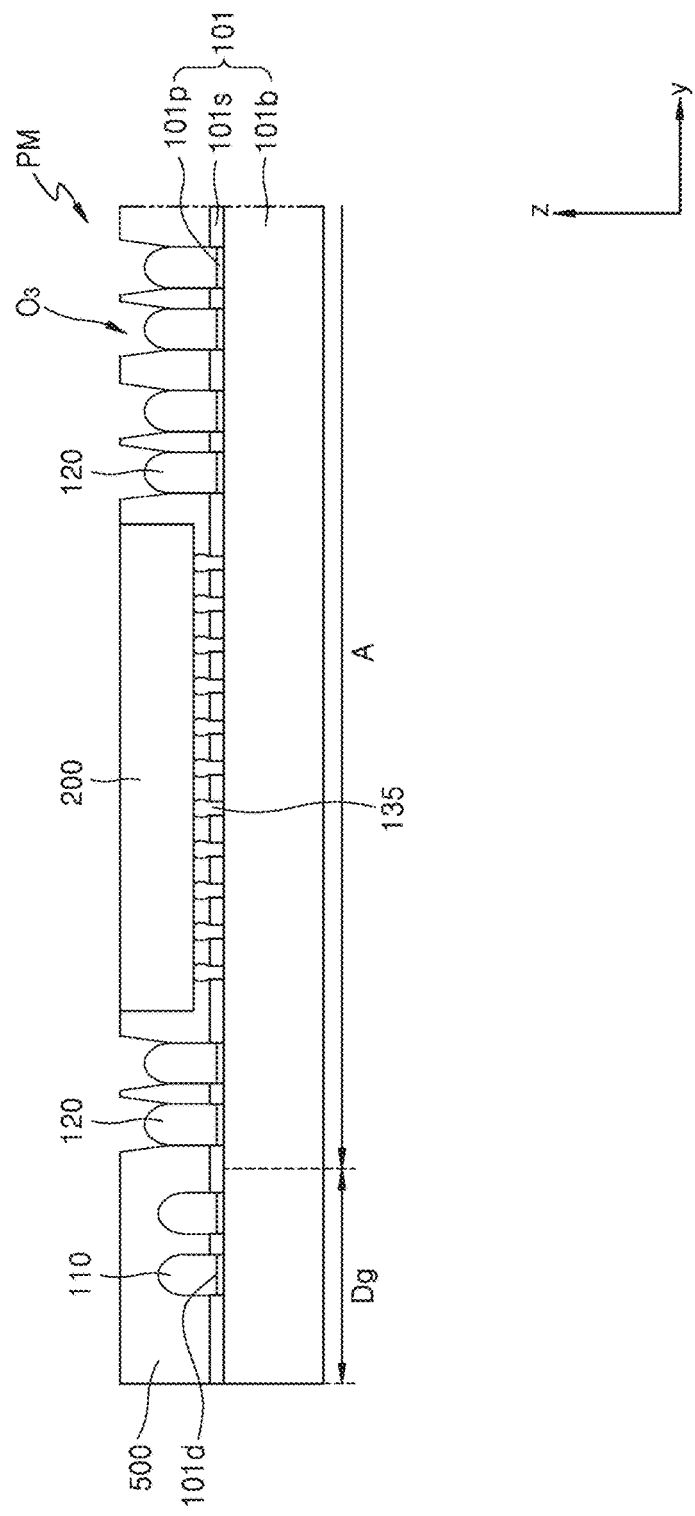

Referring to FIG. 14C, after forming the PCB molding structure PM through the E-MUF process, upper portions of the joint solder balls 120 are opened through a laser drilling process (LDP). As shown in FIG. 14C, a third opening O3 is formed in the sealing material 500b, and the upper portions of the joint solder balls 120 are exposed through the third opening O3. However, in other embodiments, different techniques may be used to expose the joint solder balls 120.

The solder balls forming the barrier 110 may not be opened. That is, a main purpose of the solder balls forming the barrier 110 is to block the impurities during the molding process, and the solder balls are not relevant with post-stacking processes of packages. In addition, the solder balls forming the barrier 110 are formed on the gate dummy area Dg, and thus, are abandoned later without forming final semiconductor packages. Therefore, in some embodiments, there is no need to expose the solder balls forming the barrier 110.

Figure 14D:
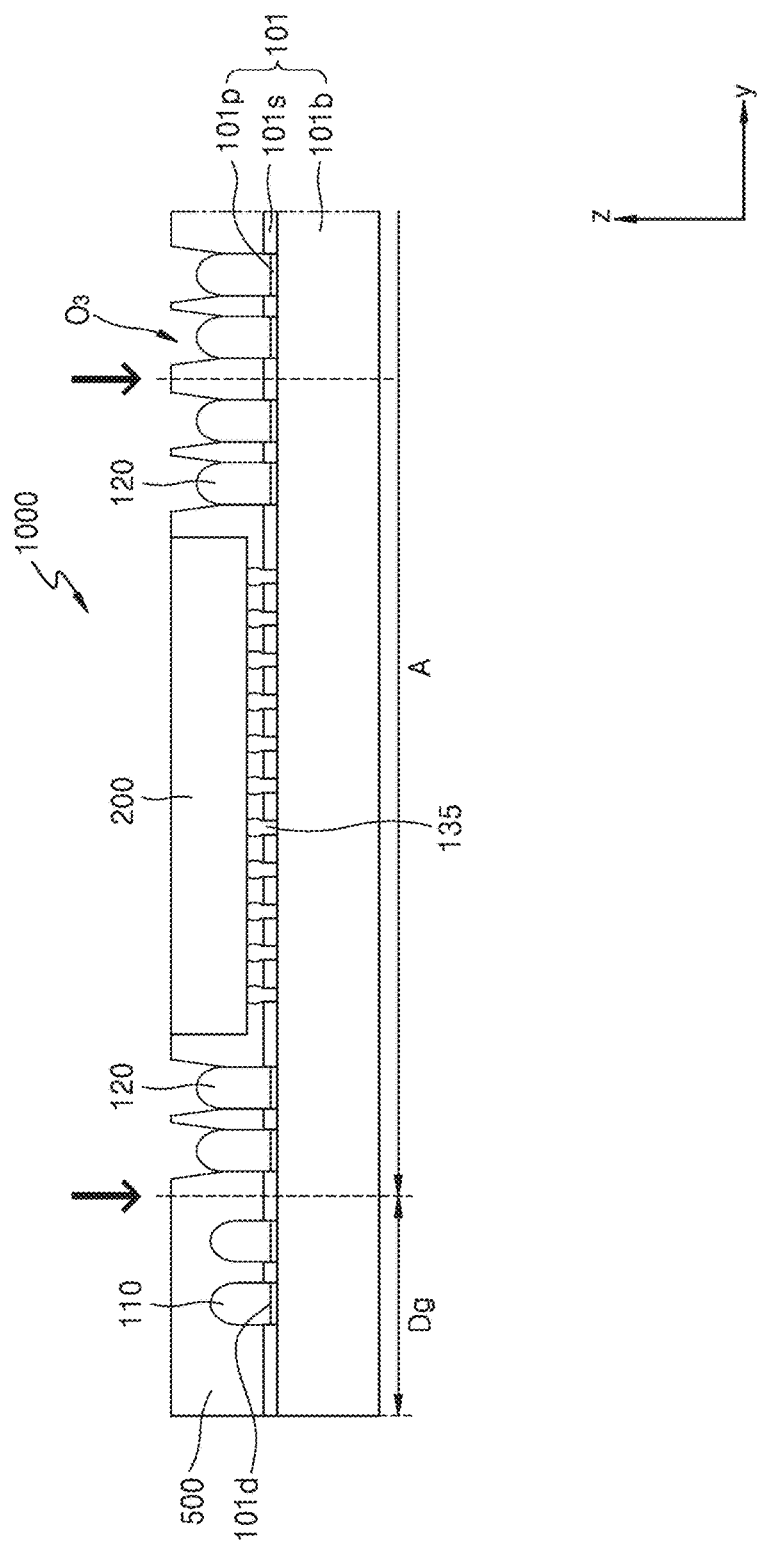

Referring to FIG. 14D, after exposing the joint solder balls 120, the PCB molding structure PM is cut by a blade as denoted by a black arrow in order to divide the PCB molding structure PM into individual lower semiconductor packages 1000. The process of PCB molding structure PM into the individual lower semiconductor packages 1000 is referred to as the saw/sorter process. Here, the sorter process may denote a process of transferring the individual lower semiconductor package 1000 through a classifier after cutting the PCB molding structure PM into the individual lower semiconductor packages. The sorter may or may not include a function of distinguishing defective goods of the lower semiconductor packages 1000.

Figure 14E:
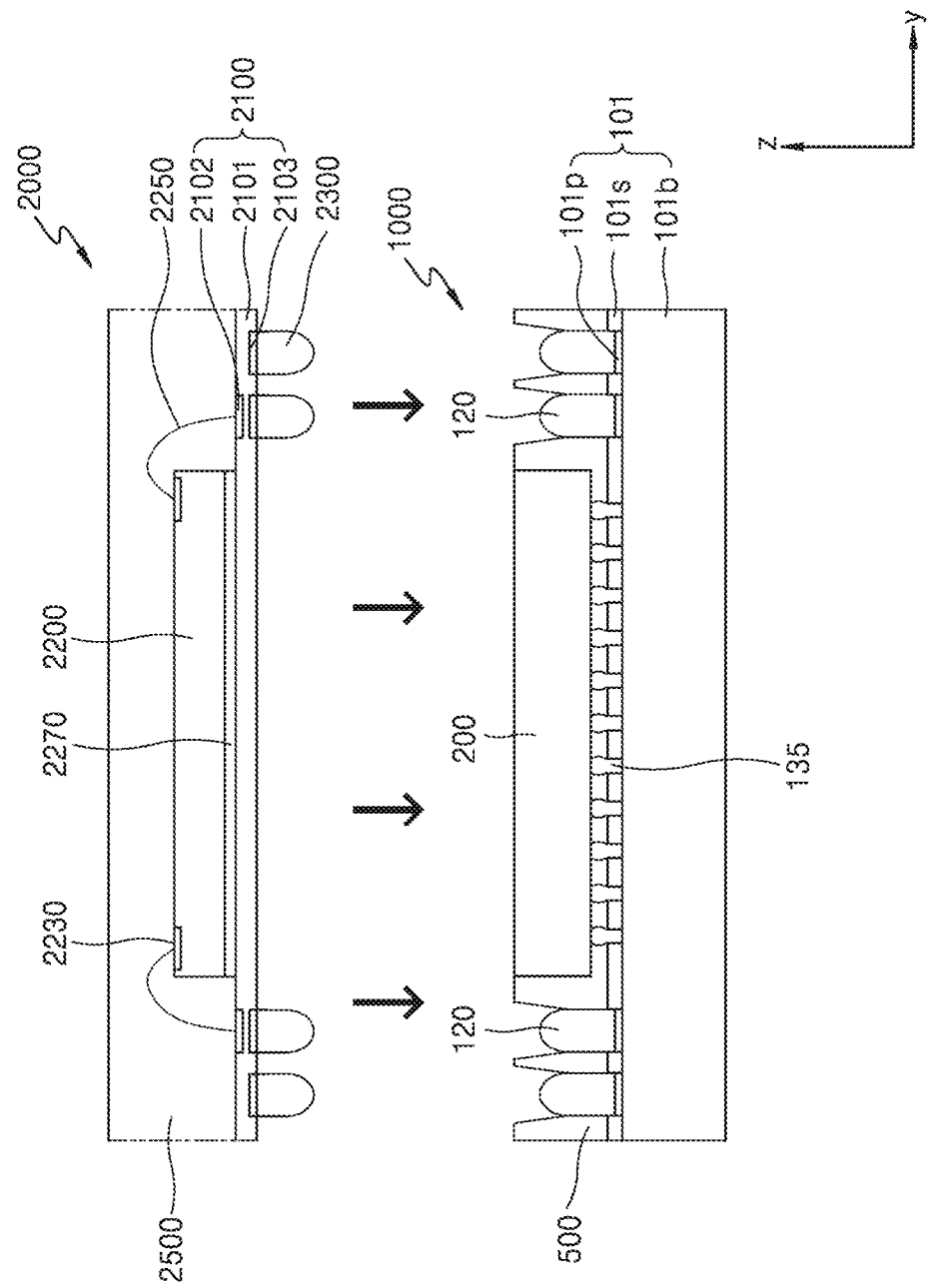
Figure 14F:
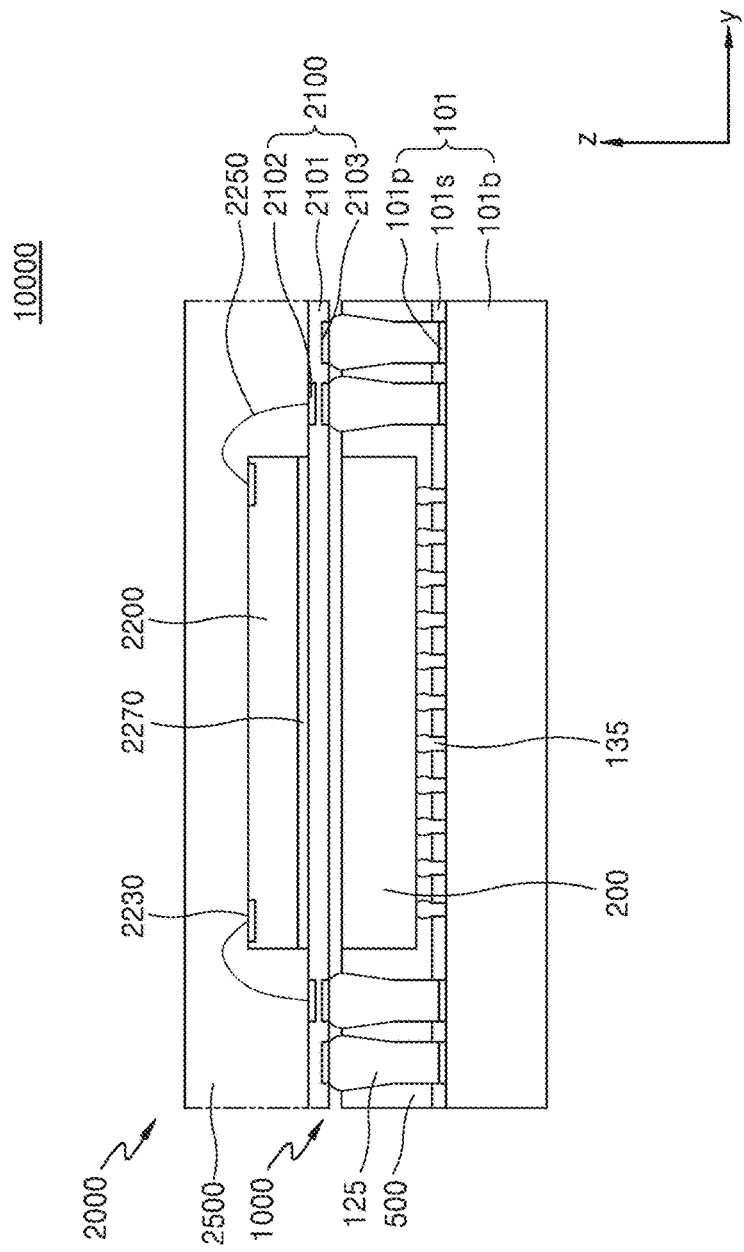

Referring to FIGS. 14E and 14F, after individualizing the PCB molding structure PM into separate semiconductor packages 1000 through the saw/sorter process, upper semiconductor packages 2000 are stacked on the lower semiconductor packages 1000 to fabricate semiconductor packages 10000 of the POP type.

The upper semiconductor package 2000 may include an upper PCB 2100, an upper semiconductor unit 2200, an upper sealing material 2500, and upper joint solder balls 2300. The upper PCB 2100 may be different from the PCBs according to one or more embodiments. For example, the semiconductor unit 2200 may be mounted on the upper PCB 2100 by a wire bonding method. Accordingly, the semiconductor unit 2200 is bonded to the upper PCB 2100 via an adhesive layer 2270, and may be electrically connected to the upper PCB 2100 via wires 2250. In particular, the electric connection via the wires 2250 may denote connecting chip pads 2230 of the semiconductor unit 2200 to substrate pads 2102 of the upper PCB 2100.

In addition, if the upper semiconductor package 2000 is formed by mounting multiple semiconductor units on an upper PCB strip, forming a PCB molding structure through a molding process, and performing the saw/sorter process, a barrier may be formed on the upper PCB strip. However, when the semiconductor unit is mounted by the wire bonding method, the joint solder balls or the bumps may not be formed on the upper PCB. Therefore, if it may be a burden to separately form the solder balls for the barrier, the barrier may be omitted.

The upper PCB 2100 may include a body layer 2101, a substrate pad 2102, and a lower pad 2103. Although not shown in the drawings, protective layers may be formed on upper and lower surfaces of the body layer 2101.

The upper joint solder balls 2300 are formed on the lower pad 2103, and may respectively correspond to the joint solder balls 120 of the lower semiconductor package 1000. In addition, in view of the PCB 100 of the lower semiconductor package 1000, the upper joint solder balls 2300 may be considered to be included in the upper PCB 2100. In addition, when the semiconductor package 10000 of the POP type is formed, the joint solder balls 120 and the upper joint solder balls 2300 may be combined to form integrated joint solder balls 125.

The upper semiconductor unit 2200 may be a memory chip, but other embodiments not limited thereto. The upper sealing material 2500 may cover side surfaces and an upper surface of the upper semiconductor unit 2200. If necessary, the upper sealing material 2500 may only cover the side surfaces of the upper semiconductor unit 2200, and the upper surface of the upper semiconductor unit 2200 may be exposed through the upper sealing material 2500.

Although not shown in the drawings, external connection terminals such as solder balls for connecting to external devices may be disposed on the lower surface of the lower semiconductor package 10000.

Figure 15A:
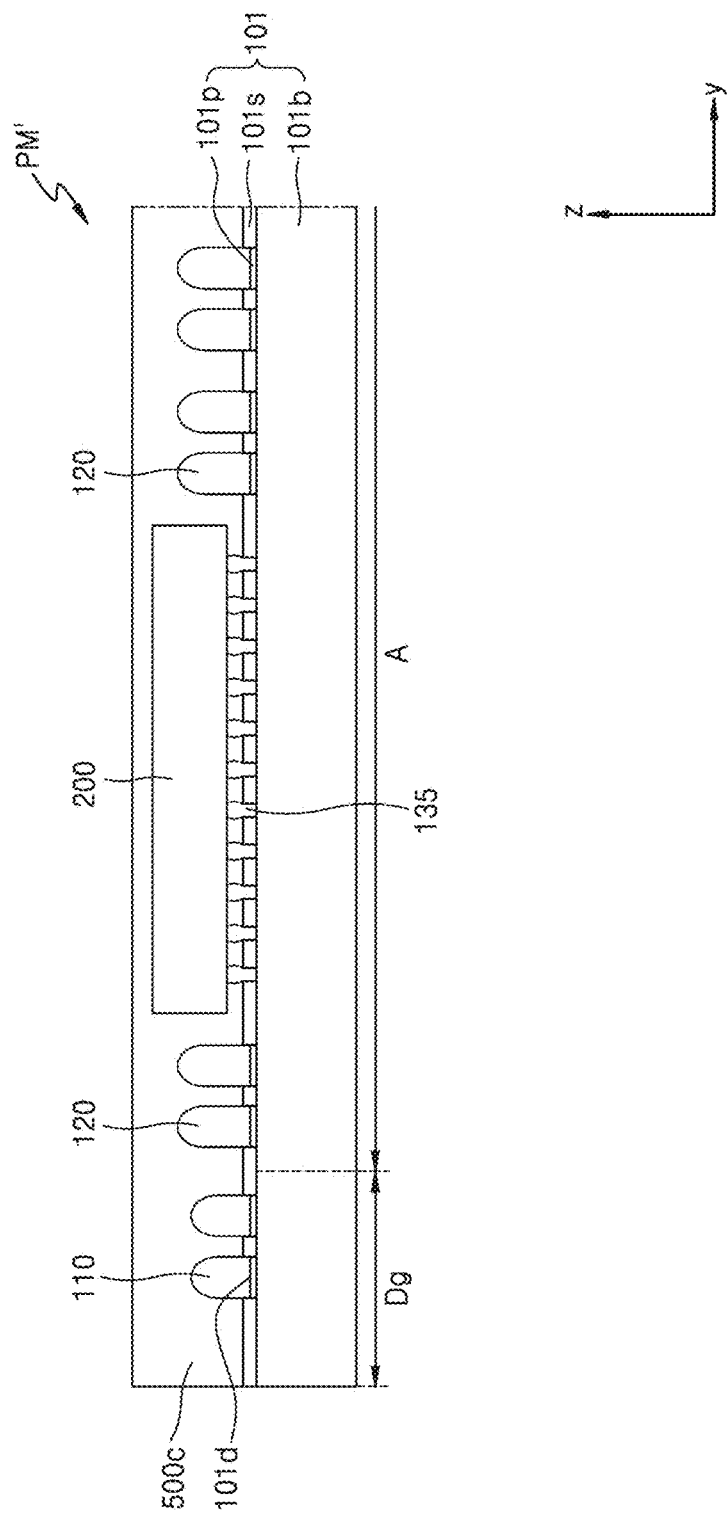
FIGS. 15A and 15B are cross-sectional views illustrating processes of manufacturing a semiconductor package of a POP type, according to an embodiment.
Figure 15B:
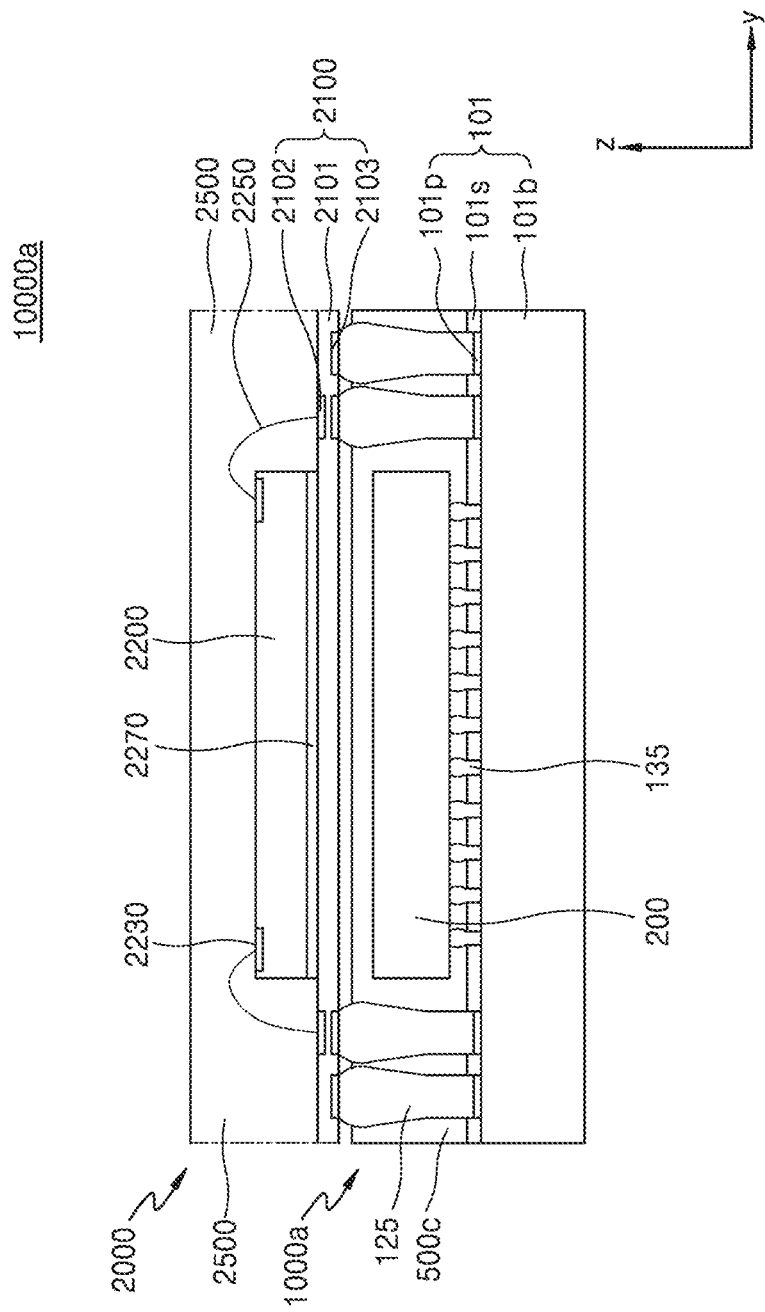

FIGS. 15A and 15B are cross-sectional views illustrating processes of manufacturing a semiconductor package of a POP type according to an embodiment. FIG. 15A may correspond to FIG. 14B and FIG. 15B may correspond to FIG. 14F. For convenience of description, elements that are described above with reference to FIGS. 14A to 14F may be described briefly or may not be described.

Referring to FIG. 15A, the semiconductor unit 200 is mounted on the chip mounting portion of the PCB 100 by the flip-chip bonding method like in FIG. 14A, and after that, a molding process is performed. Similarly to FIG. 14B, the molding process is performed in the MUF process, and the MUF process may be performed so that a sealing material 500c covers the upper surface of the semiconductor unit 200. Through the above MUF process, a PCB molding structure PM may be obtained.

After that, like in FIG. 14C, upper portions of the joint solder balls 120 are exposed through a laser drilling process, and like in FIG. 14D, the PCB molding structure PM' may be individualized into separate lower semiconductor packages 1000a (see FIG. 15A) through the saw/sorter process.

In addition, since the PCB molding structure PM has a structure, in which the sealing material 500c covers the upper surface of the semiconductor unit 200, the sealing material 500c may have a thickness that is greater than that of the sealing material 500b of FIG. 14B. Therefore, in the laser drilling process, an upper portion of the sealing material 500c may be removed more than the sealing material 500b in order to open the upper portions of the joint solder balls 120.

Referring to FIG. 15B, after individualizing the lower semiconductor packages 1000a through the saw/sorter process, upper semiconductor packages 2000 are stacked on the lower semiconductor packages 1000a to form semiconductor packages 10000a of POP type.

In the semiconductor package 10000a of this embodiment, since the sealing material 500c is greater in thickness, heights of the upper joint solder balls of the upper semiconductor package 2000 may be greater than those of the upper joint solder balls 2300 of the upper semiconductor package 2000 of FIG. 14E. In addition, heights of the integrated joint solder balls 125 after stacking the upper semiconductor package 2000 on the lower semiconductor package 1000a are also greater than those in the semiconductor package 10000 of FIG. 14F. If necessary, the heights of the joint solder balls 120 of the lower semiconductor package 1000a may be adjusted, instead of the upper joint solder balls.

Figure 16A:
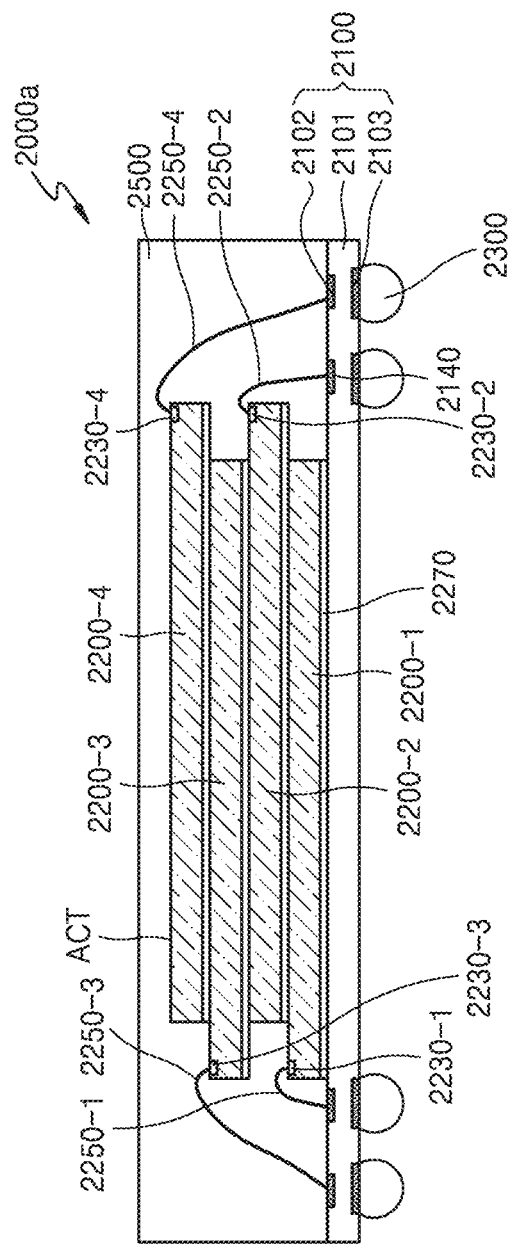
FIGS. 16A to 16C are cross-sectional views of upper semiconductor packages that may be applied to the semiconductor package of the POP type of FIG. 14F.
Figure 16B:
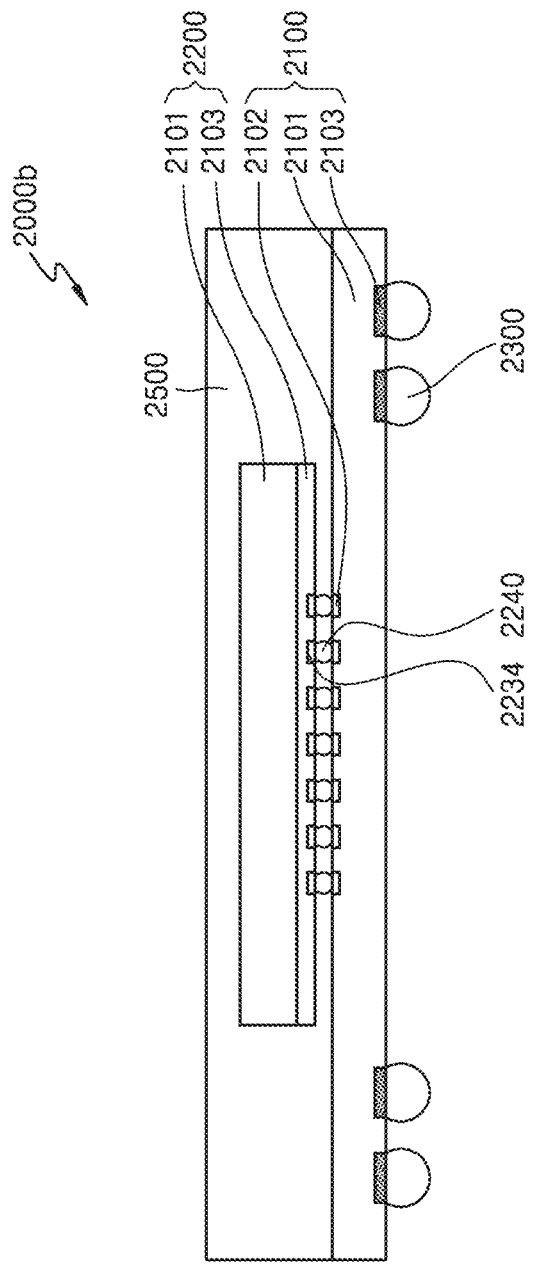
Figure 16C:
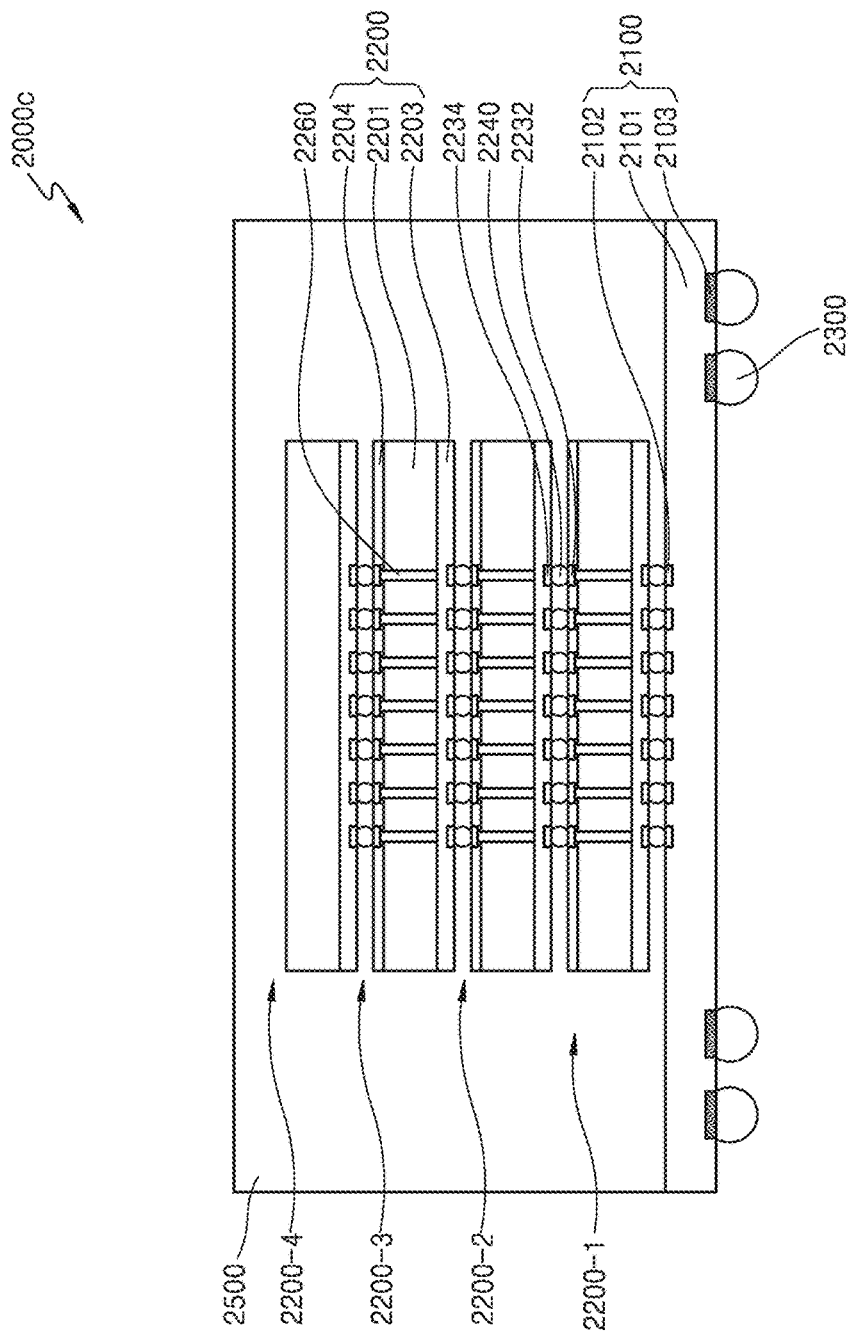

FIGS. 16A to 16C are cross-sectional views of upper semiconductor packages that may be applied to the semiconductor package of the POP type of FIG. 14F. For convenience of description, elements that are described above with reference to FIGS. 4 to 14F may be described briefly or may not be described.

Referring to FIG. 16A, an upper semiconductor package 2000a according to this embodiment may be different from the upper semiconductor package 2000 of FIG. 14E or FIG. 14F, in that multiple semiconductor units 2200-1, 2200-2, 2200-3, and 2200-4 are stacked to be mounted on the upper PCB 2100.

For examples, the semiconductor units of a stack structure may include a first semiconductor unit 2200-1, a second semiconductor unit 2200-2, a third semiconductor unit 2200-3, and a fourth semiconductor unit 2200-4 that are sequentially stacked on the upper PCB 2100. The first to fourth semiconductor units 2200-1 to 2200-4 of the stack structure may be electrically connected to the upper PCB 2100 via wire bonding.

In addition, the first to fourth semiconductor units 2200-1 to 2200-4 are stacked on the upper PCB 2100 in zigzag structure, but are not limited to the zigzag structure. For example, the first to fourth semiconductor units 2200-1 to 2200-4 may be stacked on the upper PCB 2100 as a stair structure. In addition, although four semiconductor units, that is, the first to fourth semiconductor units 2200-1 to 2200-4 are shown, in other embodiments, the number of the semiconductor units is not limited thereto. For example, three or less semiconductor units or five or more semiconductor units may be provided.

The upper PCB 2100, the upper joint solder balls 2300, and the sealing material 2500 may be the same as those of the upper semiconductor package 2000 illustrated in FIG. 14E or FIG. 14F.

Referring to FIG. 16B, an upper semiconductor package 2000b according to this embodiment may be different from the upper semiconductor package 2000 of FIG. 14E or FIG. 14F, in that the semiconductor units 2200 are mounted on the upper PCB 2100 by the flip-chip bonding method. In particular, the semiconductor units 2200 may be mounted on the upper PCB 2100 via multiple upper bumps 2240. Since the semiconductor units 2200 are mounted on the upper PCB 2100 by the flip-chip bonding method, the sealing material 2500 may be formed through the MUF process or the E-MUF process.

In addition, similarly to the lower semiconductor package 1000 of FIG. 14E or FIG. 14F, the upper semiconductor package 2000b may be formed by mounting multiple semiconductor units on an upper PCB strip by the flip-chip bonding method, forming the PCB molding structure through the molding process, and individualizing the semiconductor packages through the saw/sorter process. Therefore, a barrier including solder balls may be formed on the upper PCB strip.

Referring to FIG. 16C, an upper semiconductor package 2000c according to this embodiment may be different from the upper semiconductor package 2000b of FIG. 16B, in that multiple semiconductor units 2200-1, 2200-2, 2200-3, and 2200-4 are stacked and mounted on the upper PCB 2100. In particular, the semiconductor units of a stack structure may include a first semiconductor unit 2200-1, a second semiconductor unit 2200-2, a third semiconductor unit 2200-3, and a fourth semiconductor unit 2200-4 that are sequentially stacked on the upper PCB 2100. The first to fourth semiconductor units 2200-1 to 2200-4 may be, for example, memory chips, but other embodiments are not limited thereto.

In addition, the first to fourth semiconductor units 2200-1 to 2200-4 may be electrically connected to the upper PCB 2100 via fine bumps 2240 and a through silicon via (TSV) 2260 by the flip-chip bonding method. For example, each of the first to fourth semiconductor units 2200-1 to 2200-4 may include a body layer 2201, a wiring layer 2203, a protective layer 2204, and a TSV 2260. Also, each of the first to fourth semiconductor units 2200-1 to 2200-4 may include a lower pad 2234 on the wiring layer 2203, and an upper pad 2232 on the protective layer 2204. The fourth semiconductor unit 2200-4 may not include the TSV and the upper pad 2232.

As a reference, the TSV 2260 may be electrically connected to the lower pad 2234 by penetrating through the body layer 2201. The TSV 2260 may have one of a via-first structure, a via-middle structure, and a via-last structure. In the upper semiconductor package 2000c according to this embodiment, the TSV 2260 may have the via-middle structure. In addition, the TSV 2260 may include at least one metal layer, e.g., a wall metal layer (not shown) and a wiring metal layer (not shown). The wall metal layer may include Ti, TiN, Ta, or TaN, and the wiring metal layer may include Cu or W. However, materials forming the wall metal layer and the wiring metal layer are not limited to the above materials. In addition, a spacer insulating layer (not shown) may be disposed between the TSV 2260 and the body layer 2201.

In the upper semiconductor package 2000c according to this embodiment, the sealing material 2500 may be formed so as to expose an upper surface of the fourth semiconductor unit 2200-4 in order to reduce a height of the semiconductor package. In this case, the molding process may be performed as the E-MUF process.

In the upper semiconductor package 2000c according to this embodiment, there are four semiconductor units, that is, first to fourth semiconductor units 2200-1 to 2200-4, are provided, but the number of the semiconductor units is not limited thereto. For example, three or less semiconductor units or five or more semiconductor units may be provided.

In addition, the upper PCB 2100, the upper joint solder balls 2300, and the sealing material 2500 are the same as those of the upper semiconductor package 2000 illustrated in FIG. 14E or FIG. 14F.

Figure 17:
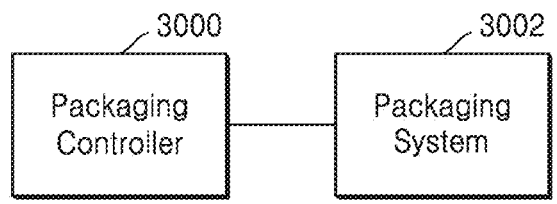
FIG. 17 is a schematic view of a packaging system according to an embodiment.

FIG. 17 is a schematic view of a packaging system according to an embodiment. In this embodiment, a system includes a packaging controller 3000 and a packaging system 3002. The packaging controller 3000 is configured to control the operations of the packaging system 3002. The packaging system 3002 may include various inputs to receive substrate bodies 101, semiconductor units 200, upper semiconductor packages 2000, or the like. The packaging system 3002 may be configured to form one or more of the various barriers 110 or perform the other operations described herein. The packaging controller 3000 may include a general purpose processor, a digital signal processor (DSP), an application specific integrated circuit, a microcontroller, a programmable logic device, discrete circuits, a combination of such devices, or the like and may include interface circuitry configured to interface with the packaging system 3002. Accordingly, the packaging controller 3000 may be configured to control the operations of the packaging system 3002 to perform the various operations described herein.

Embodiments include a printed circuit board (PCB) having a structure capable of minimizing damage on a semiconductor package during post-processes of a molding by blocking introduction of impurities in the molding process, a method of manufacturing the PCB, and a method of manufacturing a semiconductor package by using the PCB.

Some embodiments include a PCB including: a substrate body including an active area and a dummy area on an outer portion of the active area, wherein a two-dimensional array of semiconductor units is mounted on the active area, and the substrate body is rectangular extending lengthwise in a first direction; and a barrier formed on a gate dummy area located in the dummy area, wherein the barrier extends in the first direction, and the gate dummy area is adjacent to a gate, through which a molding resin is injected during a molding process.

Some embodiments include a PCB including: a substrate body including a gate dummy area and a first row mounting region; and a barrier formed on the gate dummy area, wherein the gate dummy area is adjacent to a gate, through which a molding resin is injected during a molding process, the first row mounting region includes mounting portions on which semiconductor units are to be mounted, wherein the mounting portions are arranged adjacent to the gate dummy area and in parallel with the gate dummy area, and the barrier extends in a line and protrudes from an upper surface of the substrate body.

Some embodiments include a method of manufacturing a PCB, the method including: forming a pad on a substrate; applying a solder resist to an upper surface of the substrate; patterning the solder resist to expose the pad; and forming solder balls on exposed portions of the pad, wherein the forming of the solder balls includes forming a barrier on a gate dummy area that is adjacent to a gate, through which a molding resin is injected during a molding process, and the barrier extends in line protruding from an upper surface of the substrate.

Some embodiments include a method of manufacturing a semiconductor package, the method including: preparing a PCB that includes an active area of a substrate and a dummy area on an outer portion of the active area, wherein mounting portions are arranged on the active area, and the preparing includes forming a barrier which extends in a line and protrudes from an upper surface of the substrate on a gate dummy area that is adjacent to a gate in the dummy area and forming solder balls around the mounting portions on the active area; mounting semiconductor units on the mounting portions by flip-chip bonding; forming a PCB molding structure by disposing the PCB in a mold and injecting a molding resin through the gate to seal the semiconductor units; exposing upper portions of the solder balls by removing a portion of the PCB molding structure; dividing the PCB molding structure into lower semiconductor packages by cutting the PCB molding structure along saw lanes; and stacking an upper semiconductor package on each of the lower semiconductor packages.

While particular embodiments have been particularly shown and described with reference to the drawings, it will be understood that various changes in form and details may be made therein without departing from the spirit and scope of the following claims.

What is claimed is:

1. An apparatus, comprising:
   a substrate body comprising an active area, a dummy area on an outer portion of the active area and a saw lane arranged between the active area and the dummy area, the substrate body extending lengthwise in a first direction;
   a plurality of semiconductor units mounted on the active area; and
   a barrier formed on the dummy area outside the saw lane, wherein the barrier extends in the first direction.

2. The apparatus of claim 1, wherein the barrier comprises at least one row of solder balls disposed on the dummy area.

3. The apparatus of claim 1, wherein the barrier comprises at least two rows of solder balls, and solder balls of one of the at least two rows are offset in the first direction from solder balls in at least one other row of the at least two rows.

4. The apparatus of claim 1, wherein the barrier comprises at least two rows of solder balls, and solder balls of one of the at least two rows are larger than solder balls in at least one other row of the at least two rows.

5. The apparatus of claim 1, wherein the barrier has a structure comprising at least one continuous wall or at least one row of separated walls.

6. The apparatus of claim 1, wherein:
   the barrier comprises at least one row of first solder balls; and
   the substrate body further comprises second solder balls disposed on the active area; and
   heights of the first solder balls from an upper surface of the substrate body are less than or equal to heights of the second solder balls from the upper surface of the substrate body.

7. The apparatus of claim 6, wherein:
   upper surfaces of the first solder balls and the second solder balls are lower than upper surfaces of the semiconductor units; and further comprising a molding resin disposed around the semiconductor units, exposing the upper surfaces of the semiconductor units, and covering the first and second solder balls.

8. The apparatus of claim 1, wherein:
   the semiconductor units are arranged on the active area in a 4×15 array structure or a 5×15 array structure;
   when the semiconductor units are arranged on the active area in the 4×15 array structure, the barrier comprises at least two rows of solder balls; and
   when the semiconductor units are arranged on the active area in the 5×15 array structure, the barrier comprises at least one row of solder balls.

9. A printed circuit board (PCB), comprising:
   a substrate body comprising a gate dummy area, a first row mounting region and a saw lane arranged between the gate dummy area and the first row mounting region; and
   a barrier formed on the gate dummy area outside the saw lane;
   wherein:
      the first row mounting region comprises a plurality of mounting portions arranged along a line, each of the plurality of mounting portions including a plurality of pads; and
      the barrier extends alongside the plurality of mounting portions of the first row mounting region, wherein the barrier protrudes from an upper surface of the substrate body.

10. The PCB of claim 9, wherein the barrier comprises at least one row of solder balls in the gate dummy area.

11. The PCB of claim 9, wherein the barrier comprises at least two rows of solder balls, and solder balls included in one of the at least two rows are offset in a direction in which the barrier extends from solder balls included an adjacent row among the at least two rows.

12. The PCB of claim 9, wherein:
   the barrier comprises at least one row of first solder balls;
   second solder balls are formed on the pads of the mounting portions; and
   heights of the first solder balls are lower than heights of the second solder balls.

13. The PCB of claim 9, wherein:
   the barrier comprises at least one row of first solder balls;
   second solder balls are formed on the pads of the mounting portions; and
   a plurality of fine bumps are formed within the second solder balls of each of the mounting portions.

14. The PCB of claim 9, wherein the substrate body comprises:
   a second row mounting region to a fourth row mounting region arranged in parallel with the first row mounting region, opposite to the gate dummy area or the second row mounting region to a fifth row mounting region arranged in parallel with the first row mounting region, opposite to the gate dummy area; and
   the barrier comprises at least one row of solder balls.

15. An apparatus, comprising:
   a substrate;
   an array of semiconductor units mounted on a surface of the substrate;
   a plurality of first solder balls electrically connected to the semiconductor units through the substrate;
   a saw lane disposed on the substrate and between the first solder balls and an edge of the substrate; and a barrier disposed on the substrate and between the balls saw lane and the edge of the substrate, the barrier extending from the surface of the substrate.

16. The apparatus of claim 15, wherein the barrier comprises a plurality of second solder balls on which no components are mounted.

17. The apparatus of claim 15, wherein the barrier extends along at least two sides of the array of semiconductor units.

18. The apparatus of claim 15, further comprising a mold layer encapsulating the barrier and including openings exposing the first solder balls.

19. The apparatus of claim 15, wherein the barrier is electrically insulated from the semiconductor units.

* * * * *